(12) United States Patent
Ito

(10) Patent No.: US 7,535,766 B2
(45) Date of Patent: *May 19, 2009

(54) SYSTEMS FOR PARTITIONED SOFT PROGRAMMING IN NON-VOLATILE MEMORY

(75) Inventor: Fumitoshi Ito, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 286 days.

This patent is subject to a terminal disclaimer.

(21) Appl. No.: 11/549,564

(22) Filed: Oct. 13, 2006

(65) Prior Publication Data

US 2008/0089133 A1 Apr. 17, 2008

(51) Int. Cl.
*G11C 11/34* (2006.01)
(52) U.S. Cl. .................. 365/185.22; 365/185.28; 365/185.19; 365/185.18
(58) Field of Classification Search .......... 365/185.22, 365/185.28, 185.19, 185.18
See application file for complete search history.

(56) References Cited

U.S. PATENT DOCUMENTS

| | | | |
|---|---|---|---|
| 4,489,400 | A | 12/1984 | Southerland, Jr. |
| 4,580,247 | A | 4/1986 | Adam |
| 5,293,337 | A | 3/1994 | Aritome et al. |
| 5,428,568 | A | 6/1995 | Kobayashi et al. |
| 5,491,809 | A | 2/1996 | Coffman et al. |
| 5,570,315 | A | 10/1996 | Tanaka et al. |
| 5,576,993 | A | 11/1996 | Hong |
| 5,652,719 | A | 7/1997 | Tanaka et al. |

(Continued)

FOREIGN PATENT DOCUMENTS

WO    WO0024002    4/2000

(Continued)

OTHER PUBLICATIONS

Tetsuo Endoh, et al., "A Study of High-Performance NAND Structured EEPROMS," IEICE Transactions on Electronics, Electronics Society, Tokyo, Japan, vol. E75-C, No. 11, Nov. 1, 1992, pp. 1351-1356.

(Continued)

*Primary Examiner*—Huan Hoang
*Assistant Examiner*—Jason Lappas
(74) *Attorney, Agent, or Firm*—Vierra Magen Marcus & DeNiro LLP

(57) ABSTRACT

Soft programming is performed to narrow the threshold voltage distribution of a set of erased memory cells. Soft programming can shift the threshold voltage of memory cells closer to a verify level for the erased state. A set of memory cells can be soft programmed by soft programming portions of the set to provide more consistent soft programming rates and threshold voltages. A first soft programming pulse can be applied to a first group of cells of the set while inhibiting soft programming of a second group of cells. A second soft programming pulse can then be applied to the second group of cells while inhibiting soft programming of the first group of cells. A small positive voltage of lower magnitude than the soft programming pulses can be applied to the group of cells to be inhibited. The size of the small positive voltage can be chosen so that each memory cell of the set will experience similar capacitive coupling effects from neighboring transistors when it is undergoing soft programming.

15 Claims, 23 Drawing Sheets

U.S. PATENT DOCUMENTS

| | | | |
|---|---|---|---|
| 5,768,188 | A | 6/1998 | Park et al. |
| 5,808,338 | A | 9/1998 | Gotou |
| 5,841,721 | A | 11/1998 | Kwon et al. |
| 5,963,477 | A | 10/1999 | Hung |
| 5,978,270 | A | 11/1999 | Tanaka et al. |
| 5,995,417 | A | 11/1999 | Chen et al. |
| 6,041,001 | A | 3/2000 | Estakhri |
| 6,122,198 | A | 9/2000 | Haddad et al. |
| 6,130,841 | A | 10/2000 | Tanaka et al. |
| 6,166,962 | A | 12/2000 | Chen et al. |
| 6,198,662 | B1 | 3/2001 | Chen et al. |
| 6,222,773 | B1 | 4/2001 | Tanzawa et al. |
| 6,249,459 | B1 | 6/2001 | Chen et al. |
| 6,353,556 | B2 | 3/2002 | Chen et al. |
| 6,381,174 | B1 | 4/2002 | Roohparvar et al. |
| 6,421,276 | B1 | 7/2002 | Goltman |
| 6,452,840 | B1 | 9/2002 | Sunkvalli et al. |
| 6,483,751 | B2 | 11/2002 | Chen et al. |
| 6,519,184 | B2 | 2/2003 | Tanaka et al. |
| 6,522,585 | B2 | 2/2003 | Pasternak |
| 6,525,964 | B2 | 2/2003 | Tanaka et al. |
| 6,529,413 | B2 | 3/2003 | Lee et al. |
| 6,587,903 | B2 | 7/2003 | Roohparvar |
| 6,618,288 | B2 | 9/2003 | Akaogi et al. |
| 6,620,682 | B1 | 9/2003 | Lee et al. |
| 6,643,183 | B2 | 11/2003 | Atsumi et al. |
| 6,643,184 | B2 | 11/2003 | Pio |
| 6,643,188 | B2 | 11/2003 | Tanaka et al. |
| 6,646,920 | B2 | 11/2003 | Takashina et al. |
| 6,661,711 | B2 | 12/2003 | Pan et al. |
| 6,664,587 | B2 | 12/2003 | Guterman et al. |
| 6,704,222 | B2 | 3/2004 | Guterman et al. |
| 6,711,066 | B2 | 3/2004 | Tanzawa et al. |
| 6,744,670 | B2 | 6/2004 | Tamada et al. |
| 6,771,541 | B1 | 8/2004 | Park |
| 6,842,380 | B2 | 1/2005 | Lakhani et al. |
| 6,859,397 | B2 | 2/2005 | Lutze et al. |
| 6,862,223 | B1 | 3/2005 | Lee et al. |
| 6,894,931 | B2 | 5/2005 | Yaegashi et al. |
| 6,937,524 | B2 | 8/2005 | Shiga et al. |
| 7,009,889 | B2 | 3/2006 | Tran et al. |
| 7,057,936 | B2 | 6/2006 | Yaegashi et al. |
| 7,079,437 | B2 | 7/2006 | Hazama et al. |
| 7,085,163 | B2 | 8/2006 | Martines et al. |
| 7,102,929 | B2 | 9/2006 | Lee et al. |
| 2002/0133679 | A1 | 9/2002 | Choi et al. |
| 2003/0123296 | A1 | 7/2003 | Hirano |
| 2003/0147278 | A1 | 8/2003 | Tanaka et al. |
| 2003/0189864 | A1 | 10/2003 | Sim |
| 2004/0141378 | A1 | 7/2004 | Tanzawa et al. |
| 2005/0041515 | A1 | 2/2005 | Futatsuyama et al. |
| 2005/0047216 | A1 | 3/2005 | Kojima |
| 2005/0068808 | A1 | 3/2005 | Quader |
| 2005/0105373 | A1 | 5/2005 | Takase et al. |
| 2005/0128805 | A1 | 6/2005 | Lee et al. |
| 2006/0140012 | A1 | 6/2006 | Wan et al. |
| 2006/0203550 | A1 | 9/2006 | Lee |
| 2006/0221660 | A1 | 10/2006 | Hemink et al. |
| 2006/0221661 | A1 | 10/2006 | Hemink et al. |
| 2006/0221703 | A1 | 10/2006 | Higashitani |
| 2006/0221705 | A1 | 10/2006 | Hemink et al. |
| 2006/0221708 | A1 | 10/2006 | Higashitani |
| 2006/0221709 | A1* | 10/2006 | Hemink et al. ......... 365/185.29 |
| 2006/0279992 | A1 | 12/2006 | Park et al. |
| 2006/0285387 | A1 | 12/2006 | Micheloni et al. |

FOREIGN PATENT DOCUMENTS

| | | |
|---|---|---|
| WO | WO2004013864 | 2/2004 |

OTHER PUBLICATIONS

International Search Report & The Written Opinion of the International Searching Authority, Patent Cooperation Treaty, Application No. PCT/US2007/080626 filed on Oct. 5, 2007, Mar. 19, 2008.

International Search Report & The Written Opinion of the International Searching Authority, Patent Cooperation Treaty, Application No. PCT/US2007/080740 filed on Oct. 8, 2007, Apr. 10, 2008.

Notice of Allowance and Fee(s) Due, United States Patent & Trademark Office, U.S. Appl. No. 11/025,620 entitled, "Word Line Compensation in Non-Volatile Memory Erase Operations," filed Mar. 20, 2007.

Office Action, Non-Final, United States Patent & Trademark Office, U.S. Appl. No. 11/296,032 entitled, "Systems for Erasing Non-Volatile Memory Utilizing Changing Word Line Conditions to Compensate for Slower Erasing Memory Cells," filed Feb. 28, 2007.

Office Action, Non-Final, United States Patent & Trademark Office, U.S. Appl. No. 11/296,028 entitled, "Systems for Erasing Non-Volatile Memory Using Individual Verification and Additional Erasing of Subsets of Memory Cells," filed Mar. 12, 2007.

Office Action, Election/Restriction, United States Patent & Trademark Office, U.S. Appl. No. 11/296,032 entitled, "Systems for Erasing Non-Volatile Memory Utilizing Changing Word Line Conditions to Compensate for Slower Erasing memory Cells," filed Nov. 8, 2006.

Office Action, Election/Restriction, United States Patent & Trademark Office, U.S. Appl. No. 11/296,028 entitled, "Systems for Erasing Non-Volatile Memory Using Individual Verification and Additional Erasing of Subsets of Memory Cells," filed Dec. 6, 2006.

Notice of Allowance and Fee(s) Due, United States Patent & Trademark Office, U.S. Appl. No. 11/296,071 entitled, "Systems for Soft Programming Non-Volatile Memory Utilizing Individual Verification and Additional Soft Programming of Subsets of Memory Cells," filed Dec. 5, 2006.

Notice of Allowance and Fee(s) Due, United States Patent & Trademark Office, U.S. Appl. No. 11/296,071 entitled, "Systems for Soft Programming Non-Volatile Memory Utilizing Individual Verification and Additional Soft Programming of Subsets of Memory Cells," filed Apr. 9, 2007.

Office Action, Non-Final, United States Patent & Trademark Office, U.S. Appl. No. 11/025,620 entitled, "Word Line Compensation in Non-Volatile Memory Erase Operations," filed Mar. 31, 2006.

Supplemental Notice of Allowability, United States Patent & Trademark Office, U.S. Appl. No. 11/025,620 entitled, "Word Line Compensation in Non-Volatile Memory Erase Operations," filed Mar. 26, 2007.

Notice of Allowance and Fee(s) Due, United States Patent & Trademark Office, U.S. Appl. No. 11/549,553, filed Oct. 13, 2006, Jun. 16, 2008.

Non-Final Office Action, United States Patent & Trademark Office, U.S. Appl. No. 11/025,620, filed Dec. 29, 2004, Jul. 13, 2007.

International Preliminary Report on Patentability (Chapter 1 of the Patent Cooperation Treaty), Patent Cooperation Treaty, Application No. PCT/US2005/045557 filed on Dec. 15, 2005, Jul. 12, 2007.

Notice of Allowance and Fee(s) Due, United States Patent & Trademark Office, U.S. Appl. No. 11/296,028, filed Dec. 6, 2005, Aug. 6, 2007.

Supplemental Notice of Allowability, United States Patent & Trademark Office, U.S. Appl. No. 11/296,028, filed Dec. 6, 2005, Sep. 4, 2007.

Allowed Claims, U.S. Appl. No. 11/296,028, filed, Dec. 6, 2005.

Notice of Allowance and Fee(s) Due, United States Patent & Trademark Office, U.S. Appl. No. 11/296,071, filed Dec. 6, 2005, Aug. 9, 2007.

Allowed Claims, U.S. Appl. No. 11/296,071, filed Dec. 6, 2005.

Non-final Office Action, United States Patent & Trademark Office, U.S. Appl. No. 11/296,055, filed Dec. 6, 2005, Oct. 2, 2007.

U.S. Appl. No. 11/549,545, filed Oct. 13, 2006.

U.S. Appl. No. 11/549,533, filed Oct. 13, 2006.

U.S. Appl. No. 11/549,553, filed Oct. 13, 2006.

Notice of Allowance and Fee(s) Due, United States Patent & Trademark Office, U.S. Appl. No. 11/549,533 filed on Oct. 13, 2006, Oct. 6, 2008.

Notice of Allowance and Fee(s) Due, United States Patent & Trademark Office, U.S. Appl. No. 11/549,515 filed on Oct. 13, 2006, Oct. 8, 2008.

* cited by examiner

Fig. 10

| | Erase | Erase verify | Soft-program | Soft-program verify |
|---|---|---|---|---|
| Bit Line | Floating | Floating | 0V | Floating |
| SGD | Floating | $V_{SG}$ | $V_{DD}$ | $V_{SG}$ |
| WLi | 0V | $E_{verify}$ | $V_{spgm}$ | $E_{verify}$ |
| WLi-1 | 0V | $E_{verify}$ | $V_{spgm}$ | $E_{verify}$ |
| . | 0V | $E_{verify}$ | $V_{spgm}$ | $E_{verify}$ |
| . | 0V | $E_{verify}$ | $V_{spgm}$ | $E_{verify}$ |
| . | 0V | $E_{verify}$ | $V_{spgm}$ | $E_{verify}$ |
| . | 0V | $E_{verify}$ | $V_{spgm}$ | $E_{verify}$ |
| WL1 | 0V | $E_{verify}$ | $V_{spgm}$ | $E_{verify}$ |
| WL0 | 0V | $E_{verify}$ | $V_{spgm}$ | $E_{verify}$ |
| SGS | Floating | $V_{SG}$ | 0V | $V_{SG}$ |
| Source Line | Floating | $V_{DD}$ | $V_{DD}$ | $V_{DD}$ |
| P-well | $V_{erase}$ | 0V | 0V | 0V |

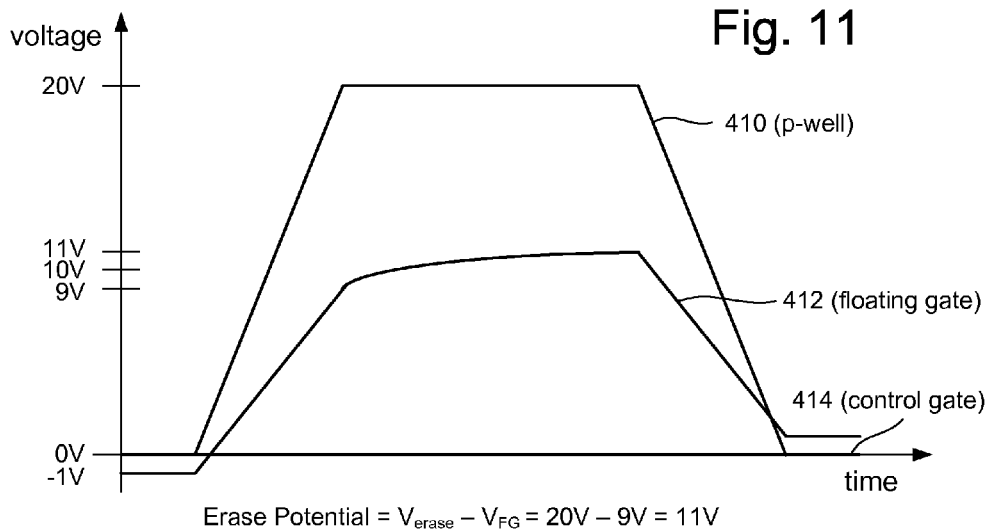

Fig. 11

Erase Potential = $V_{erase} - V_{FG}$ = 20V − 9V = 11V

Erase Potential = $V_{erase} - V_{FG}$ = 20V − 10V = 10V

|  |  | 440 first subset erase | 442 second subset erase | 444 string-level verify |
|---|---|---|---|---|
| Bit Line |  | Floating | Floating | 0V |
| SGD |  | Floating | Floating | $V_{SG}$ |
| WLn | B | Floating | 0V | $E_{verify}$ |
| WLn-1 | A | 0V | Floating | $E_{verify}$ |
| . | B | Floating | 0V | $E_{verify}$ |
| . | A | 0V | Floating | $E_{verify}$ |
| . | B | Floating | 0V | $E_{verify}$ |
| . | A | 0V | Floating | $E_{verify}$ |
| WL1 | B | Floating | 0V | $E_{verify}$ |
| WL0 | A | 0V | Floating | $E_{verify}$ |
| SGS |  | Floating | Floating | $V_{SG}$ |
| Source Line |  | Floating | Floating | $V_{DD}$ |
| P-well |  | $V_{erase}$ | $V_{erase}$ | 0V |

Fig. 15 first subset of word lines defined by {WL2i}, where i is an integer
word line series = {WLx; WLx+2; WLx+4; ... }, where WLx is first word line of string
second subset of word lines defined by {WL2i+1}, where i is an integer
word line series = {WLx+1; WLx+3; WLx+5; ... }, where WLx is first word line of string

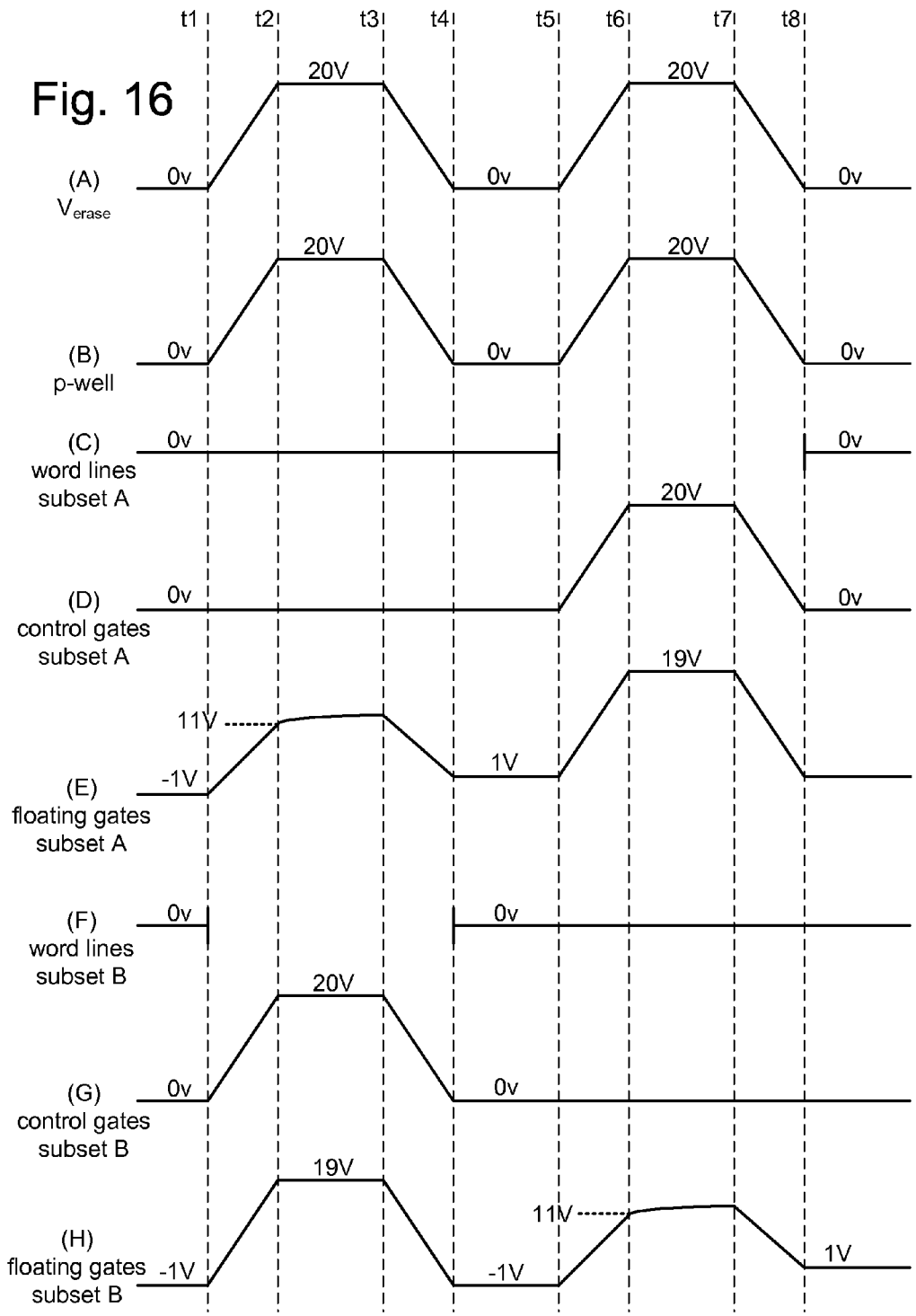

|  |  | 440 first subset erase | 442 second subset erase | 446 first subset verify | 448 second subset verify |
|---|---|---|---|---|---|
| Bit Line |  | Floating | 0V | 0V | 0V |
| SGD |  | Floating | Floating | $V_{SG}$ | $V_{SG}$ |
| WLn | B | Floating | 0V | $V_{pass}$ | $E_{verify}$ |
| WLn-1 | A | 0V | Floating | $E_{verify}$ | $V_{pass}$ |
| · | B | Floating | 0V | $V_{pass}$ | $E_{verify}$ |
| · | A | 0V | Floating | $E_{verify}$ | $V_{pass}$ |
| · | B | Floating | 0V | $V_{pass}$ | $E_{verify}$ |
| · | A | 0V | Floating | $E_{verify}$ | $V_{pass}$ |
| WL1 | B | Floating | 0V | $V_{pass}$ | $E_{verify}$ |
| WL0 | A | 0V | Floating | $E_{verify}$ | $V_{pass}$ |
| SGS |  | Floating | Floating | $V_{SG}$ | $V_{SG}$ |
| Source Line |  | Floating | Floating | $V_{DD}$ | $V_{DD}$ |
| P-well |  | $V_{erase}$ | $V_{erase}$ | 0V | 0V | first subset of word lines defined by {WL2i}, where i is an integer
word line series = {WLx; WLx+2; WLx+4; ... }, where WLx is first word line of string second subset of word lines defined by {WL2i+1}, where i is an integer
word line series = {WLx+1; WLx+3; WLx+5; ... }, where WLx is first word line of string

Fig. 19

|  |  | 650 first subset erase | 652 second subset erase | 654 first subset verify | 656 second subset verify |
| --- | --- | --- | --- | --- | --- |
| Bit Line |  | Floating | 0V | 0V | 0V |
| SGD |  | Floating | Floating | $V_{SG}$ | $V_{SG}$ |
| $WL_n$ | B | Floating | 0V | $V_{pass}$ | $E_{verify}$ |
| $WL_{n-1}$ | B | Floating | 0V | $V_{pass}$ | $E_{verify}$ |
| · | A | 0V | Floating | $E_{verify}$ | $V_{pass}$ |
| · | A | 0V | Floating | $E_{verify}$ | $V_{pass}$ |
| · | B | Floating | 0V | $V_{pass}$ | $E_{verify}$ |
| · | B | Floating | 0V | $V_{pass}$ | $E_{verify}$ |
| $WL_1$ | A | 0V | Floating | $E_{verify}$ | $V_{pass}$ |
| $WL_0$ | A | 0V | Floating | $E_{verify}$ | $V_{pass}$ |
| SGS |  | Floating | Floating | $V_{SG}$ | $V_{SG}$ |
| Source Line |  | Floating | Floating | $V_{DD}$ | $V_{DD}$ |
| P-well |  | $V_{erase}$ | $V_{erase}$ | 0V | 0V | first subset of word lines defined by the series = {WLx; WLx+1; WLx+4; WLx+5 ... },
where WLx is first word line of string second subset of word lines defined by the series = {WLx+2; WLx+3; WLx+6; WLx+7 ... },
where WLx is first word line of string

Fig. 21

|  |  | 750 soft-program first subset | 752 soft-program second subset | 754 string-level soft-program verify |
|---|---|---|---|---|
| Bit Line |  | 0V ($V_{DD}$) | 0V ($V_{DD}$) | floating |
| SGD |  | $V_{DD}$ | $V_{DD}$ | $V_{SG}$ |
| WLn | B | $V_{use1}$ | $V_{spgm}$ | $E_{verify}$ |
| WLn-1 | A | $V_{spgm}$ | $V_{use1}$ | $E_{verify}$ |
| · | B | $V_{use1}$ | $V_{spgm}$ | $E_{verify}$ |
| · | A | $V_{spgm}$ | $V_{use1}$ | $E_{verify}$ |
| · | B | $V_{use1}$ | $V_{spgm}$ | $E_{verify}$ |
| · | A | $V_{spgm}$ | $V_{use1}$ | $E_{verify}$ |
| WL1 | B | $V_{use1}$ | $V_{spgm}$ | $E_{verify}$ |
| WL0 | A | $V_{spgm}$ | $V_{use1}$ | $E_{verify}$ |
| SGS |  | 0V | 0V | $V_{SG}$ |
| Source Line |  | 0V | 0V | $V_{DD}$ |
| P-well |  | 0V | 0V | 0V |

Fig. 24 first subset of word lines defined by {WL2i}, where i is an integer
word line series = {WLx; WLx+2; WLx+4; ... }, where WLx is first word line of string second subset of word lines defined by {WL2i+1}, where i is an integer
word line series = {WLx+1; WLx+3; WLx+5; ... }, where WLx is first word line of string

|  |  | soft-program first subset 830 | soft-program second subset 832 | soft-program verify first subset 834 | soft-program verify second subset 836 |
|---|---|---|---|---|---|
| Bit Line |  | 0V ($V_{DD}$) | 0V ($V_{DD}$) | floating | floating |
| SGD |  | $V_{DD}$ | $V_{DD}$ | $V_{SG}$ | $V_{SG}$ |
| WLn | B | $V_{use1}$ | $V_{spgm}$ | $V_{pass}$ | $E_{verify}$ |
| WLn-1 | A | $V_{spgm}$ | $V_{use1}$ | $E_{verify}$ | $V_{pass}$ |
| . | B | $V_{use1}$ | $V_{spgm}$ | $V_{pass}$ | $E_{verify}$ |
| . | A | $V_{spgm}$ | $V_{use1}$ | $E_{verify}$ | $V_{pass}$ |
| . | B | $V_{use1}$ | $V_{spgm}$ | $V_{pass}$ | $E_{verify}$ |
| . | A | $V_{spgm}$ | $V_{use1}$ | $E_{verify}$ | $V_{pass}$ |
| WL1 | B | $V_{use1}$ | $V_{spgm}$ | $V_{pass}$ | $E_{verify}$ |
| WL0 | A | $V_{spgm}$ | $V_{use1}$ | $E_{verify}$ | $V_{pass}$ |
| SGS |  | 0V | 0V | $V_{SG}$ | $V_{SG}$ |
| Source Line |  | 0V | 0V | $V_{DD}$ | $V_{DD}$ |
| P-well |  | 0V | 0V | 0V | 0V | first subset of word lines defined by {WL2i}, where i is an integer
word line series = {WLx; WLx+2; WLx+4; ... }, where WLx is first word line of string second subset of word lines defined by {WL2i+1}, where i is an integer
word line series = {WLx+1; WLx+3; WLx+5; ... }, where WLx is first word line of string

Fig. 27

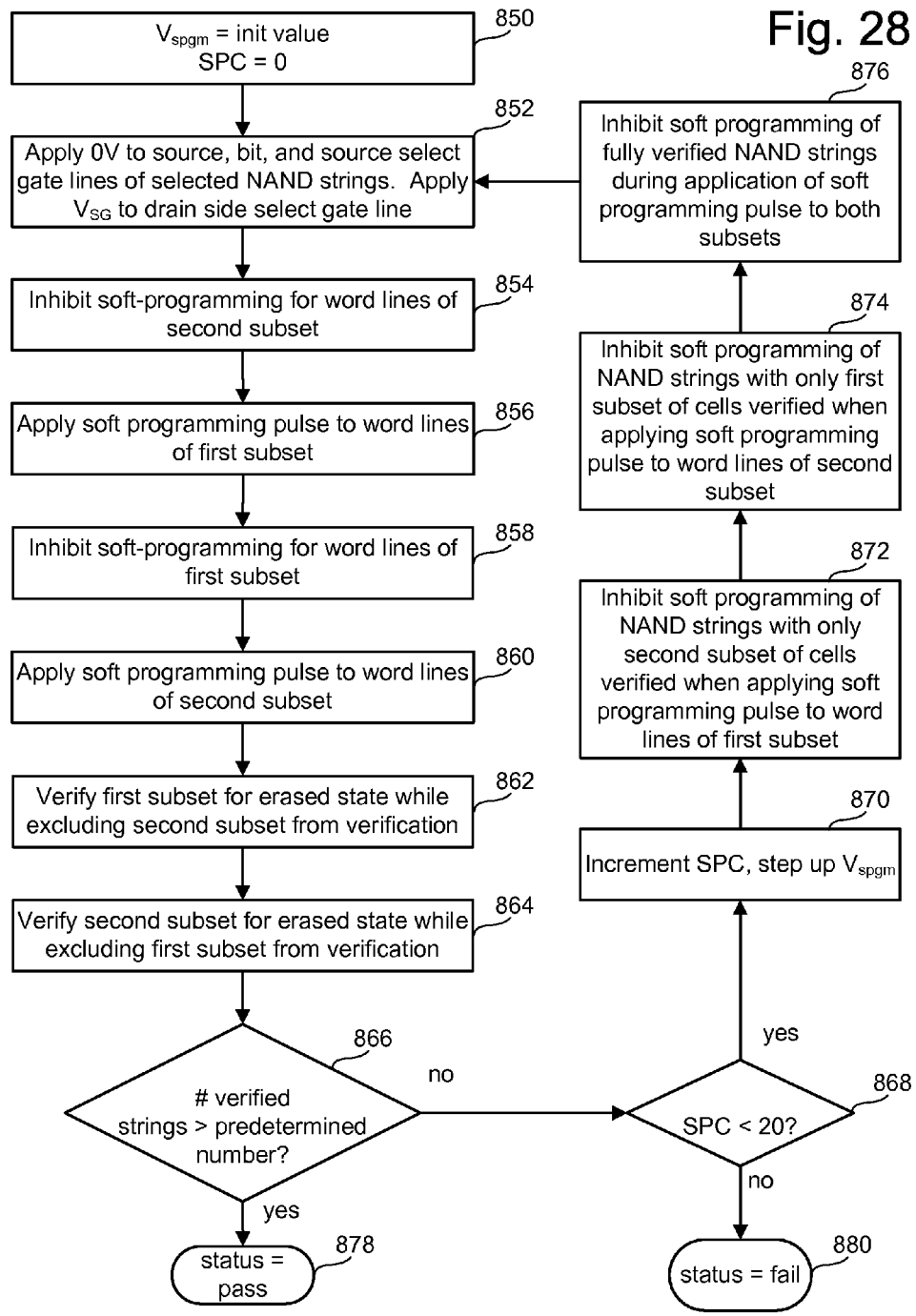

| | | 900 soft-program first subset | 902 soft-program second subset | 904 soft-program verify first subset | 906 soft-program verify second subset |
|---|---|---|---|---|---|
| Bit Line | | 0V ($V_{DD}$) | 0V ($V_{DD}$) | floating | floating |
| SGD | | $V_{DD}$ | $V_{DD}$ | $V_{SG}$ | $V_{SG}$ |
| WLn | B | $V_{use1}$ | $V_{spgm}$ | $V_{pass}$ | $E_{verify}$ |
| WLn-1 | B | $V_{use1}$ | $V_{spgm}$ | $V_{pass}$ | $E_{verify}$ |
| . | A | $V_{spgm}$ | $V_{use1}$ | $E_{verify}$ | $V_{pass}$ |
| . | A | $V_{spgm}$ | $V_{use1}$ | $E_{verify}$ | $V_{pass}$ |
| . | B | $V_{use1}$ | $V_{spgm}$ | $V_{pass}$ | $E_{verify}$ |
| . | B | $V_{use1}$ | $V_{spgm}$ | $V_{pass}$ | $E_{verify}$ |
| WL1 | A | $V_{spgm}$ | $V_{use1}$ | $E_{verify}$ | $V_{pass}$ |
| WL0 | A | $V_{spgm}$ | $V_{use1}$ | $E_{verify}$ | $V_{pass}$ |
| SGS | | 0V | 0V | $V_{SG}$ | $V_{SG}$ |
| Source Line | | 0V | 0V | $V_{DD}$ | $V_{DD}$ |
| P-well | | 0V | 0V | 0V | 0V | first subset of word lines defined by the series = {WLx; WLx+1; WLx+4; WLx+5 ... }, where WLx is first word line of string second subset of word lines defined by the series = {WLx+2; WLx+3; WLx+6; WLx+7 ... }, where WLx is first word line of string

Fig. 29

SYSTEMS FOR PARTITIONED SOFT PROGRAMMING IN NON-VOLATILE MEMORY

CROSS-REFERENCE TO RELATED APPLICATIONS

The following applications are cross-referenced and incorporated by reference herein in their entirety:

U.S. patent application Ser. No. 11/549,553, entitled "Partitioned Soft Programming in Non-Volatile Memory," by Fumitoshi Ito, filed on even date herewith;

U.S. patent application Ser. No. 11/549,515, entitled "Partitioned Erase and Erase Verification in Non-Volatile Memory," by Fumitoshi Ito, filed on even date herewith; and U.S. patent application Ser. No. 11/549,533, entitled "Systems for Partitioned Erase and Erase Verification in Non-Volatile Memory," by Fumitoshi Ito, filed on even date herewith.

BACKGROUND OF THE INVENTION

1. Field of the Invention

Embodiments of the present disclosure relate generally to semiconductor technology for erasing and soft programming non-volatile memory devices.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM), including flash EEPROM, and Electronically Programmable Read Only Memory (EPROM) are among the most popular non-volatile semiconductor memories.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by applying appropriate voltages to control gate 120CG via selection line SGD. Select gate 122 is controlled by applying the appropriate voltages to control gate 122CG via selection line SGS. Each of the transistors 100, 102, 104 and 106 includes a control gate and a floating gate, forming the gate elements of a memory cell. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

A typical architecture for a flash memory system using a NAND structure will include several NAND strings. For example, FIG. 3 shows three NAND strings 202, 204 and 206 of a memory array having many more NAND strings. Each of the NAND strings of FIG. 3 includes two select transistors or gates and four memory cells. For example, NAND string 202 includes select transistors 220 and 230, and memory cells 222, 224, 226 and 228. NAND string 204 includes select transistors 240 and 250, and memory cells 242, 244, 246 and 248. Each string is connected to the source line by one select gate (e.g. select gate 230 and select gate 250). A selection line SGS is used to control the source side select gates. The various NAND strings are connected to respective bit lines by select gates 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224 and memory cell 244. Word line WL1 is connected to the control gates for memory cell 226 and memory cell 246. Word line WL0 is connected to the control gates for memory cell 228 and memory cell 248. As can be seen, a bit line and respective NAND string comprise a column of the array of memory cells. The word lines (WL3, WL2, WL1 and WL0) comprise the rows of the array. Each word line connects the control gates of each memory cell in the row. For example, word line WL2 is connected to the control gates for memory cells 224, 244 and 252.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after a program operation is positive and defined as logic "0." When the threshold voltage is negative and a read is attempted by applying 0 volts to the control gate, the memory cell will turn on to indicate logic "1" is being stored. When the threshold voltage is positive and a read operation is attempted by applying 0 volts to the control gate, the memory cell will not turn on, which indicates that logic "0" is stored. A memory cell can also store multiple levels of information, for example, multiple bits of digital data. In the case of storing multiple levels of data, the range of possible threshold voltages is divided into the number of levels of data. For example, if four levels of information are stored, there will be four threshold voltage ranges assigned to the data values "11", "10", "01", and "00." In one example of a NAND type memory, the threshold voltage after an erase operation is negative and defined as "11." Three different positive threshold voltages are used for the states of "10", "01", and "00."

Relevant examples of NAND type flash memories and their operation are provided in the following U.S. patents/patent applications, all of which are incorporated herein by reference: U.S. Pat. No. 5,570,315; U.S. Pat. No. 5,774,397, U.S. Pat. No. 6,046,935, U.S. Pat. No. 6,456,528 and U.S. patent application. Ser. No. 09/893,277 (Publication No. US2003/0002348).

When programming a flash memory cell, a program voltage is applied to the control gate (via a selected word line) and the bit line is grounded. Electrons from the p-well are injected into the floating gate. When electrons accumulate in the floating gate, the floating gate becomes negatively charged and the threshold voltage of the cell is raised. The floating gate charge and threshold voltage of the cell can be indicative of a particular state corresponding to stored data.

In order to erase memory cells of a NAND type flash memory, electrons are transferred from the floating gate of each memory cell to the well region and substrate. Typically, one or more high voltage (e.g., ~16V-20V) erase pulses are applied to the well region to attract electrons away from the floating gate of each memory cell to the well region. The word lines of each memory cell are grounded or supplied with 0V to create a high potential across the tunnel oxide region to attract the electrons. If each memory cell of a NAND string is not erased after application of an erase voltage pulse, the size of the pulse can be increased and reapplied to the NAND string until each memory cell is erased. The amount by which the erase voltage is increased in between pulses is typically referred to as the step size for the erase voltage.

Typical erase operations using prior art techniques can lead to differing erase rates amongst memory cells in a NAND string. Some memory cells may reach a target threshold voltage level for an erased state faster or slower than others. This can lead to over-erasure of faster erasing memory cells because they will continue to be subjected to erase voltages that are applied to sufficiently erase the slower memory cells of the NAND string. Thus, the different erase rates can result in a shorter cycling life of a memory cell or NAND string. Typical erase operations can also lead to disparate threshold voltages among memory cells of a NAND string. That is, one or more memory cells of the NAND string may have a different threshold voltage after application of one or more erase voltage pulses when compared to other memory cells of the string or device. To overcome this effect, a technique generally referred to as soft programming has been used to adjust the threshold voltages of one or more memory cells after erasure. Soft programming includes applying a relatively low program voltage—lower than used for actual programming—to one or more memory cells. Soft programming typically includes applying a program voltage as a series of pulses that are increased by a step size in between each application of the program voltage pulses. Soft programming raises the threshold voltage of the memory cells in order to narrow and/or raise the threshold voltage distribution of the population of erased memory cells. Soft programming, however, may increase program and erase times.

In addition, traditional soft programming can suffer from some of the same effects of disparate properties among different memory cells. The same memory cells that may be slow to erase, may also be slow to soft program. These slower soft programming cells can have lower erased threshold voltages than other cells of the NAND string at the conclusion of soft programming.

SUMMARY OF THE INVENTION

Soft programming is performed to narrow the threshold voltage distribution of a set of erased memory cells by shifting the threshold voltage of memory cells closer to a verify level for the erased state. A set of memory cells can be soft programmed by soft programming portions of the set to provide more consistent soft programming rates and threshold voltages. A first soft programming pulse can be applied to a first group of cells of the set while inhibiting soft programming of a second group of cells. A second soft programming pulse can then be applied to the second group of cells while inhibiting soft programming of the first group of cells. A small positive voltage of lower magnitude than the soft programming pulses can be applied to the group of cells to be inhibited. The size of the small positive voltage can be chosen so that each memory cell of the set will experience similar capacitive coupling effects from neighboring transistors when it is undergoing soft programming.

In one embodiment, non-volatile memory is soft programmed by applying a soft programming voltage to a first subset of a set of non-volatile storage elements while inhibiting a second subset of the set from soft programming and applying the soft programming voltage to the second subset while inhibiting the first subset from soft programming. Soft programming of the set of storage elements is verified after applying the soft programming voltage to the first subset and second subset. At least one of applying the soft programming voltage to the first subset and applying the soft programming voltage to the second subset is repeated if the set is not verified as soft programmed.

In one embodiment, the subsets are chosen so that each memory cell of the set will have similarly biased neighboring transistors while it is subjected to the soft programming pulse. For example, the end memory cells in a NAND string that are adjacent to the select gates for the string may soft program slower than the remaining memory cells of the string because of the bias conditions applied to the select gates during soft programming. The subsets can be chosen along with the voltage applied to the to be inhibited subset so that the interior and end memory cells have similarly biased neighboring transistors during soft programming.

Some exemplary implementations include a plurality of non-volatile storage elements, a set of control lines (e.g., word lines, bit lines or other control lines) in communication with the non-volatile storage elements, and managing circuitry for performing the processes discussed herein.

Other features, aspects, and objects of embodiments of the disclosed technology can be obtained from a review of the specification, the figures, and the claims.

BRIEF DESCRIPTION OF THE DRAWINGS

FIG. 10 is a table depicting exemplary bias conditions for performing an erase operation according to prior art techniques.

FIG. 11 is a graph depicting voltages at various portions of a NAND string during an ideal erase operation.

FIG. 15 is a table depicting bias conditions for erasing and verifying erasure of a set of non-volatile storage elements according to one embodiment.

FIG. 16 depicts voltage signals and resulting potentials at various portions of a NAND string during an erase operation in accordance with one embodiment.

FIG. 19 it a table depicting bias conditions for erasing and verifying erasure of a set of non-volatile storage elements in accordance with one embodiment utilizing subset-based verification.

FIG. 21 is a table depicting bias conditions for erasing and verifying erasure of a set of non-volatile storage elements in accordance with one embodiment.

FIG. 24 is a table depicting bias conditions for soft programming and soft programming verification in one embodiment.

FIG. 27 is a table depicting bias conditions for soft programming, including subset-level verification in accordance with one embodiment.

FIG. 28 is a flowchart for soft programming with subset-level verification in accordance with one embodiment.

FIG. 29 is a table depicting bias conditions for soft programming and soft programming verification in accordance with one embodiment.

DETAILED DESCRIPTION

Figure 4:
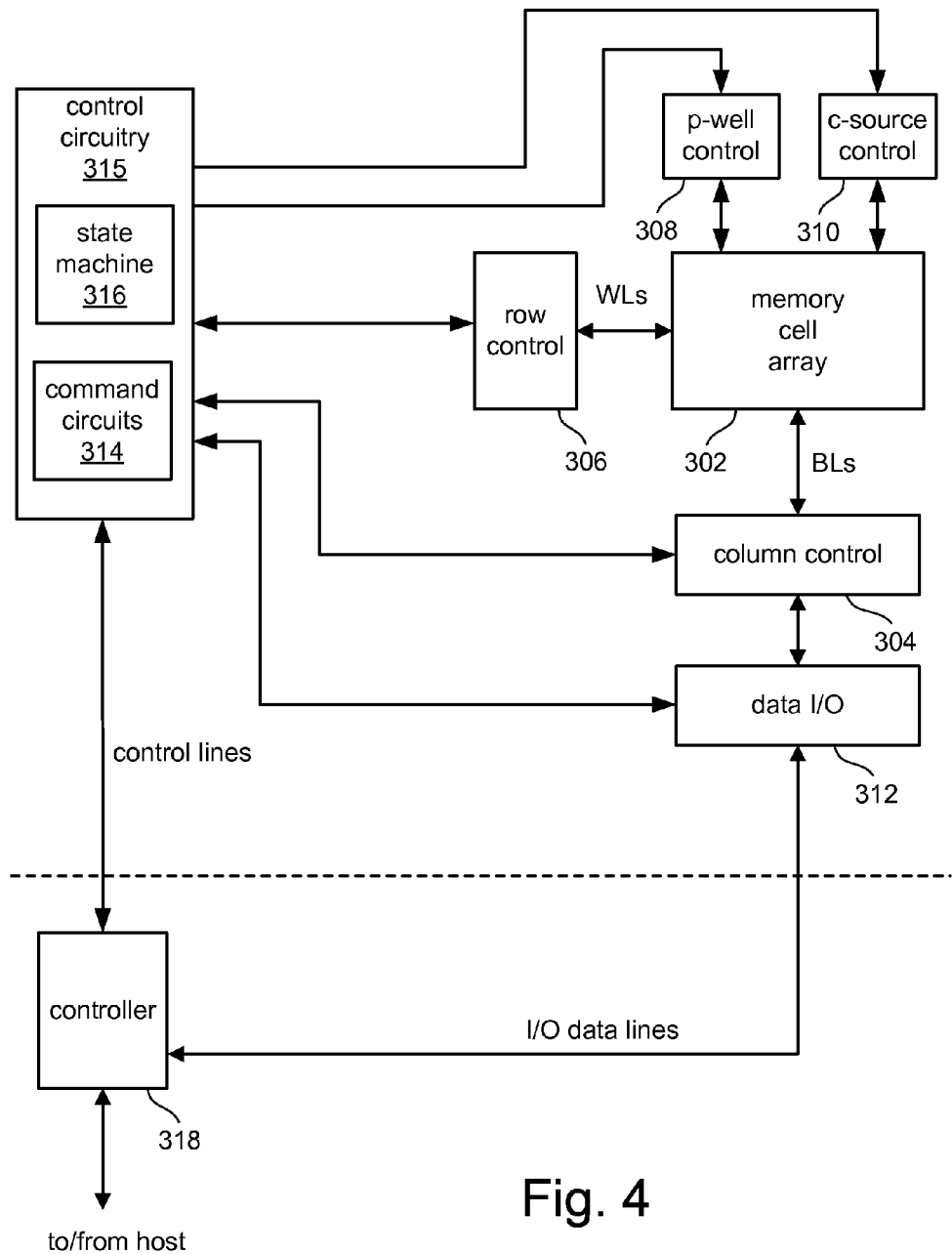
FIG. 4 is a block diagram of one embodiment of a non-volatile memory system in which the various aspects of one embodiment can be implemented.

FIG. 4 is a block diagram of one embodiment of a flash memory system that can be used to implement one or more embodiments of the present disclosure. Other systems and implementations can be used. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote or inhibit programming and erasing. Row control circuit 306 is connected to the word lines to select one of the word lines, to apply read voltages, to apply program voltages combined with the bit line potential levels controlled by column control circuit 304, and to apply an erase voltage. C-source control circuit 310 controls a common source line (labeled as "C-source" in FIG. 4) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316 which is part of control circuitry 315. State machine 316 controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected to or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314 which are part of control circuitry 315. Command circuits 314 are in communication with state machine 316. Controller 318 typically contains buffer memory for the user data being written to or read from the memory array.

In some implementations, some of the components of FIG. 4 can be combined. In various designs, one or more of the components of FIG. 4 (alone or in combination), other than memory cell array 302, can be thought of as managing circuitry. For example, managing circuitry may include any one of or a combination of control circuitry 315, command circuits 314, state machine 316, column control circuit 304, row control circuit 306, p-well control circuit 308, common source control circuit 310, data I/O 312 and controller 318.

One exemplary memory system comprises one integrated circuit that includes controller 318, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

Figure 5:
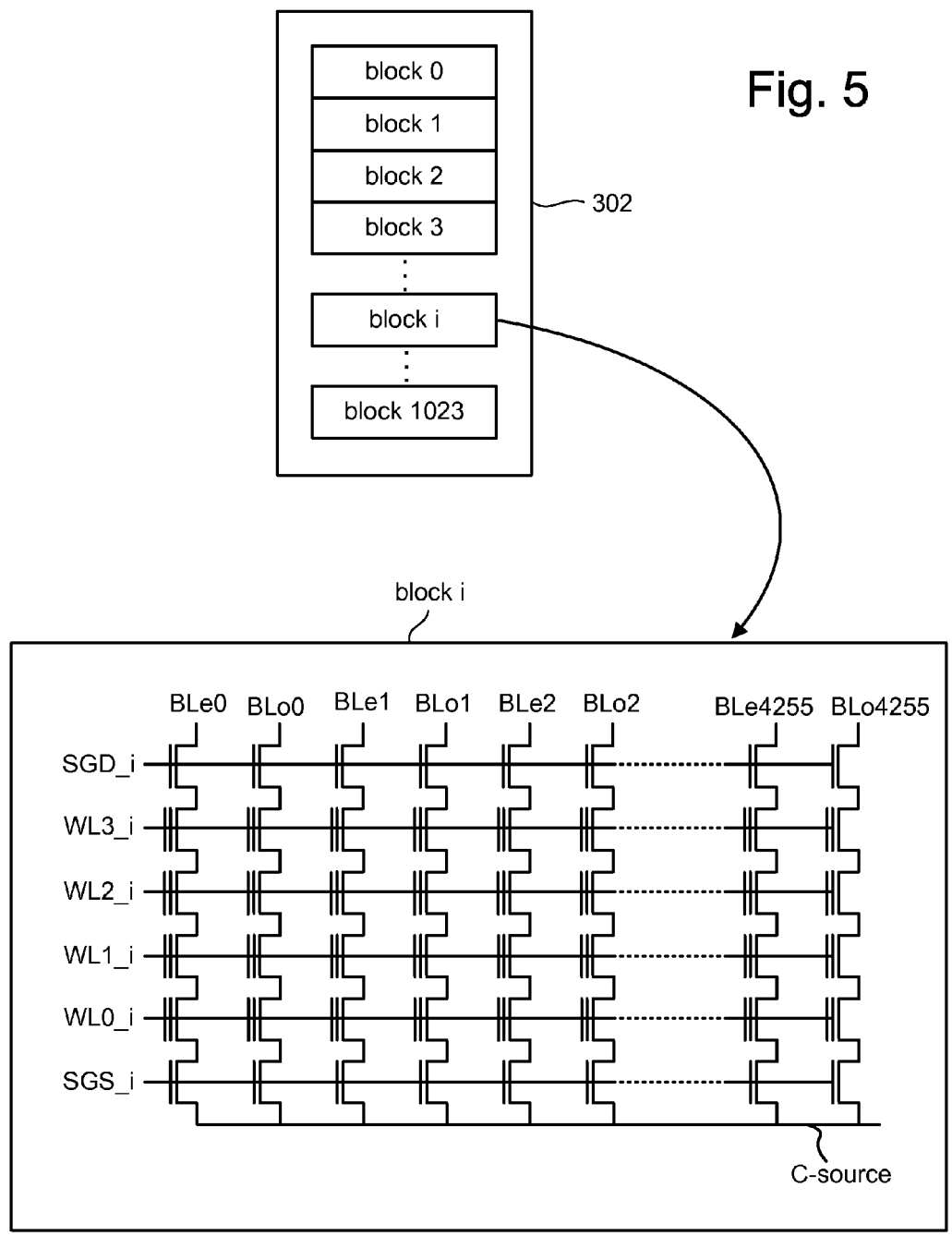
FIG. 5 illustrates an exemplary organization of a memory array.

With reference to FIG. 5, an exemplary structure of memory cell array 302 is described. As one example, a NAND flash EEPROM is described that is partitioned into 1,024 blocks. The data stored in each block can be simultaneously erased. In one embodiment, the block is the minimum unit of cells that are simultaneously erased. In each block in this example, there are 8,512 columns. Each block is typically divided into a number of pages which can be a unit of programming. Other units of data for programming are also possible and contemplated. In one embodiment, individual pages may be divided into segments and the segments may contain the fewest number of cells that are written at one time as a basic programming operation. One or more pages of data are typically stored in one row of memory cells.

In each block of the example in FIG. 5 there are 8,512 columns that are divided into even columns and odd columns. The bit lines are divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. FIG. 5 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor or gate (connected to select gate drain line SGD), and another terminal is connected to c-source via a second select transistor (connected to select gate source line SGS).

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time.

During read and programming operations of one embodiment, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. Other sized blocks and pages can also be used with embodiments. Additionally, architectures other than that of FIGS. 4 and 5 can also be used to implement embodiments.

In the read and verify operations, the select gates of a selected block are raised to one or more select voltages and the unselected word lines (e.g., WL0, WL1 and WL3) of the selected block are raised to a read pass voltage (e.g. 4.5 volts) to make the transistors operate as pass gates. The selected word line of the selected block (e.g., WL2) is connected to a reference voltage, a level of which is specified for each read and verify operation in order to determine whether a threshold voltage of the concerned memory cell is above or below such level. For example, in a read operation of a one bit memory cell, the selected word line WL2 is grounded, so that it is detected whether the threshold voltage is higher than 0V. In a verify operation of a one bit memory cell, the selected word line WL2 is connected to 0.8V, for example, so that as programming progresses it is verified whether or not the threshold voltage has reached 0.8V. The source and p-well are at zero volts during read and verify. The selected bit lines (BLe) are pre-charged to a level of, for example, 0.7V. If the threshold voltage is higher than the read or verify level, the potential level of the concerned bit line (BLe) maintains the high level, because of the associated non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is detected by a sense amplifier that is connected to the bit line and senses the resulting bit line voltage. The difference between whether the memory cell is programmed or erased depends on whether or not net negative charge is stored in the floating gate. For example, if negative charge is stored in the floating gate, the threshold voltage becomes higher and the transistor can be in enhancement mode of operation.

When programming a memory cell in one example, the drain and the p-well receive 0 volts while the control gate receives a series of programming pulses with increasing magnitudes. In one embodiment, the magnitudes of the pulses in the series range from 12 volts to 24 volts. In other embodiments, the range of pulses in the series can be different, for example, having a starting level of higher than 12 volts. During programming of memory cells, verify operations are carried out in the periods between the programming pulses. That is, the programming level of each cell of a group of cells being programmed in parallel is read between each programming pulse to determine whether or not it has reached or exceeded a verify level to which it is being programmed. One means of verifying the programming is to test conduction at a specific compare point. The cells that are verified to be sufficiently programmed are locked out, for example in NAND cells, by raising the bit line voltage from 0 to $V_{DD}$ (e.g., 2.5 volts) for all subsequent programming pulses to terminate the programming process for those cells. In some cases, the number of pulses will be limited (e.g. 20 pulses) and if a given memory cell is not sufficiently programmed by the last pulse, an error is assumed. In some implementations, memory cells are erased (in blocks or other units) prior to programming.

Figure 1:
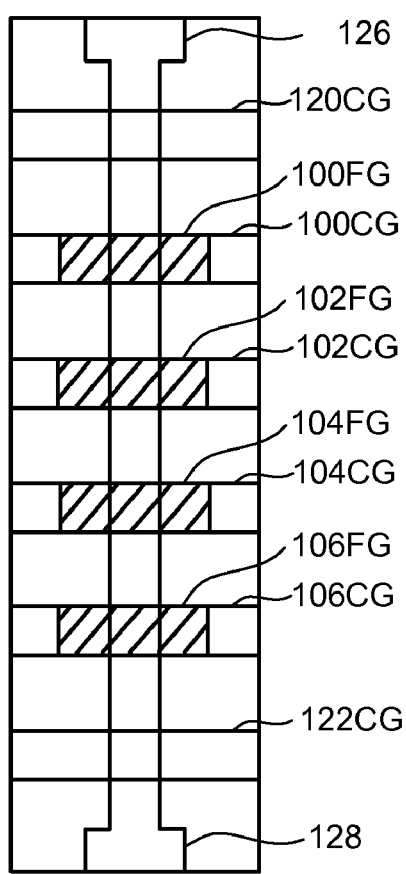
FIG. 1 is a top view of a NAND string.
Figure 2:
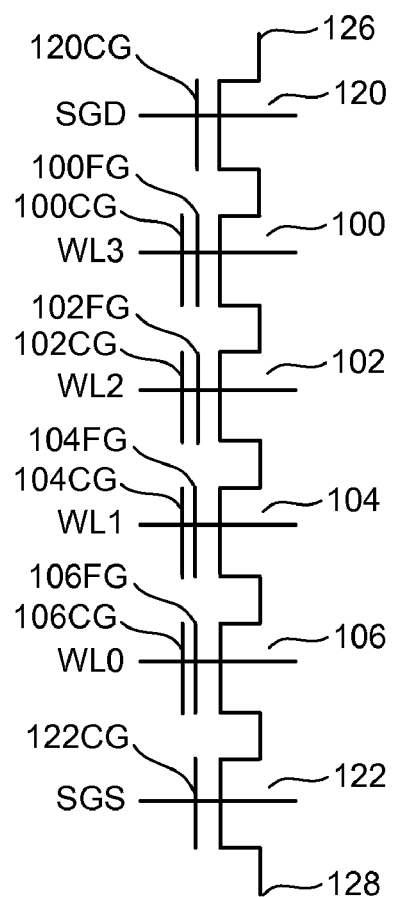
FIG. 2 is an equivalent circuit diagram of the NAND string depicted in FIG. 1.
Figure 3:
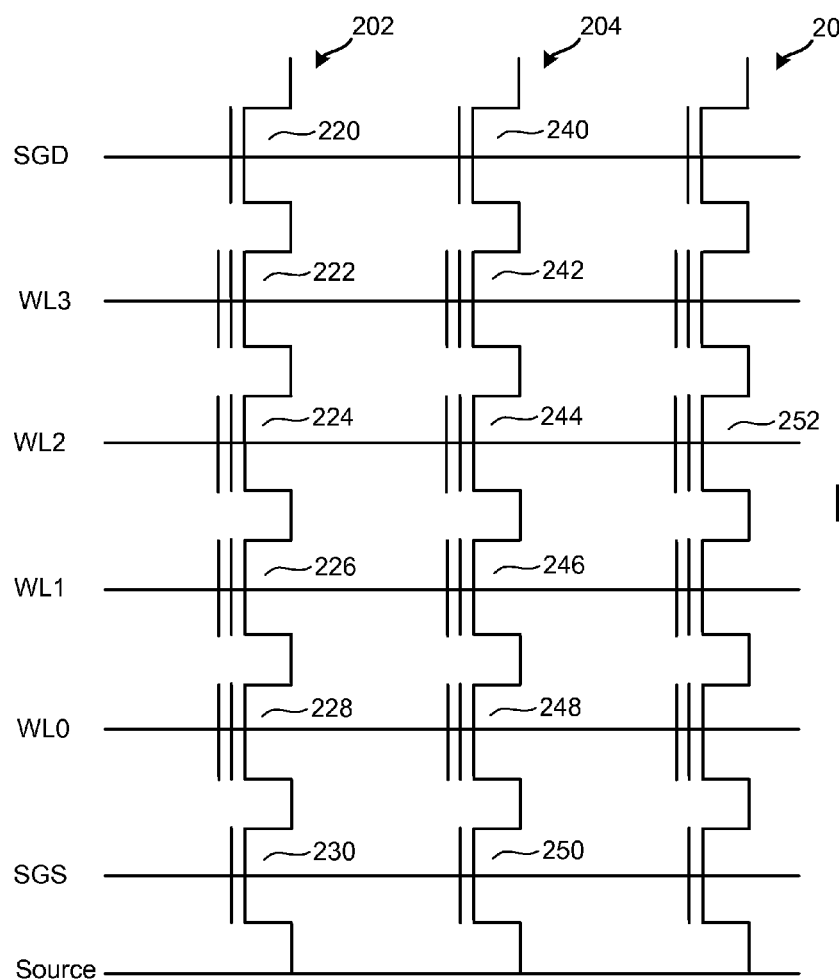
FIG. 3 is a circuit diagram depicting three NAND strings.
Figure 6:
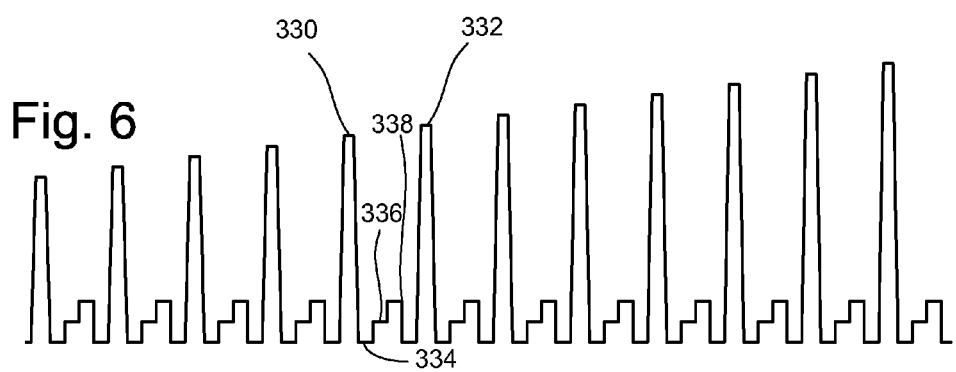
FIG. 6 depicts an exemplary program/verify voltage signal that can be applied to a selected word line in accordance with embodiments.

FIG. 6 depicts a program voltage signal in accordance with one embodiment. This signal has a set of pulses with increasing magnitudes. The magnitude of the pulses is increased with each pulse by a predetermined step size. In one embodiment that includes the memory cells storing multiple bits of data, an exemplary step size is 0.2 volts (or 0.4 volts). Between each of the program pulses are the verify pulses. The signal of FIG. 6 assumes a four state memory cell, therefore, it includes three verify pulses. For example, between programming pulses 330 and 332 are three sequential verify pulses. The first verify pulse 334 is depicted at a zero volt verify voltage level. The second verify pulse 336 follows the first verify pulse at the second verify voltage level. The third verify pulse 338 follows the second verify pulse 336 at the third verify voltage level. A multi-state memory cell capable of storing data in eight states may need to perform verify operations at seven compare points. Thus, seven verify pulses are applied in sequence to perform seven verify operations at seven verify levels between two consecutive programming pulses. Based on the seven verify operations, the system can determine the state of the memory cells. One means for reducing the time burden of verifying is to use a more efficient verify process, for example, as disclosed in: U.S. patent application Ser. No. 10/314,055, entitled "Smart Verify for Multi-State Memories," filed Dec. 5, 2002; U.S. patent application Ser. No. 11/260,658, entitled "Method for Programming of Multi-State Non-Volatile Memory Using Smart Verify, filed Oct. 27, 2005; and U.S. patent application Ser. No. 11/259,799, entitled "Apparatus for Programming of Multi-State Non-Volatile Memory Using Smart Verify," filed Oct. 27, 2005, all of which are incorporated herein by reference in their entirety.

The read and verify operations described above are performed according to techniques known in the art. Thus, many of the details explained can be varied by one skilled in the art.

Figure 7:
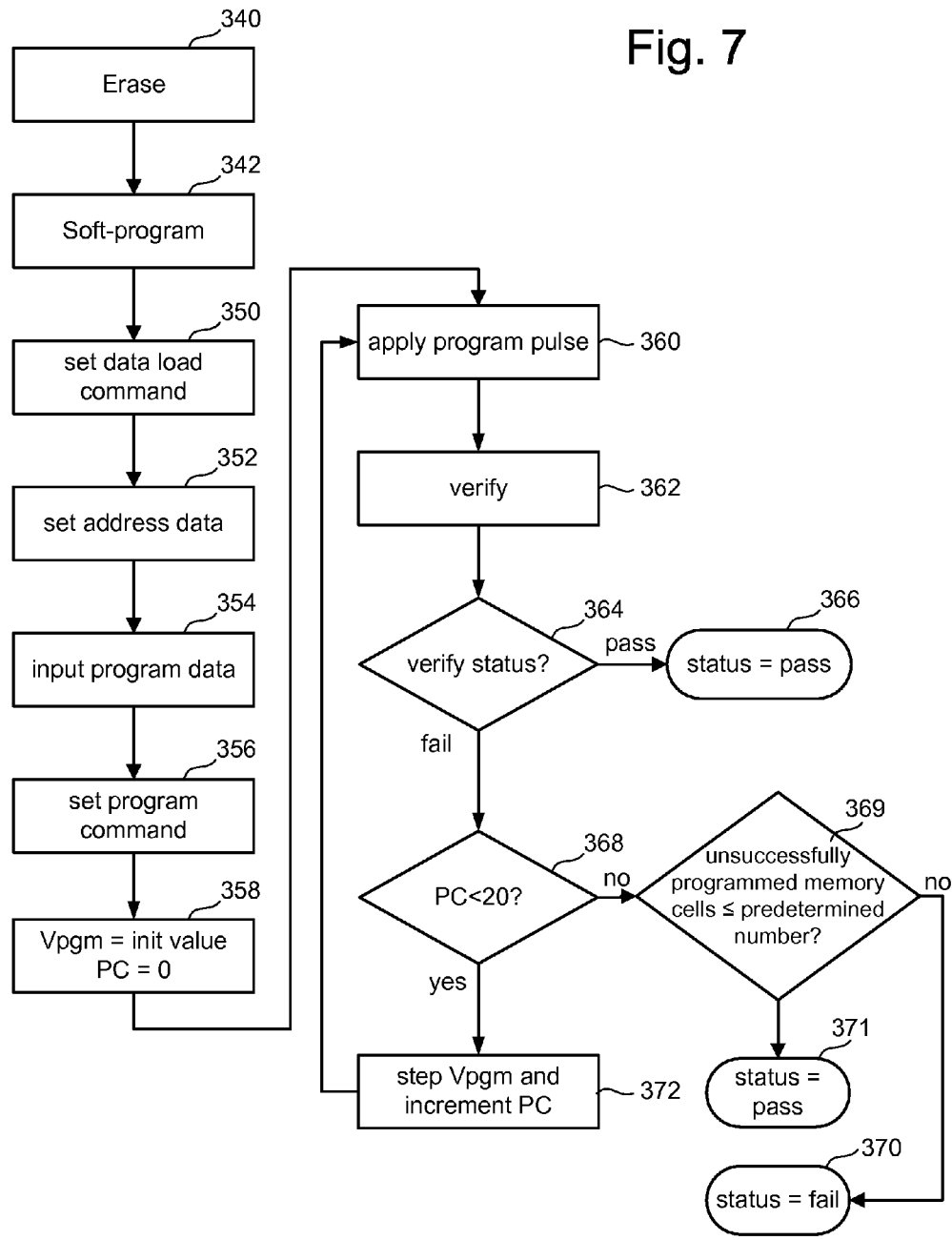
FIG. 7 is an exemplary flowchart for performing a program operation.

FIG. 7 is a flow chart describing one embodiment of a method for programming non-volatile memory. The memory cells to be programmed are erased at step 340. Step 340 can include erasing more memory cells than those to be programmed (e.g., in blocks or other units). At step 342, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells closer to the erase verify level. At step 350 of FIG. 7, a "data load" command is issued by controller 318 and input to command circuits 314, allowing data to be input to data input/output buffer 312. The input data is recognized as a command and latched by state machine 316 via a command latch signal, not illustrated, input to command circuits 314. At step 352, address data designating the page address is input to row controller or decoder 306 from the controller or host. The input data is recognized as the page address and latched via state machine 316, affected by the address latch signal input to command circuits 314. At step 354, a page of program data for the addressed page is input to data input/output buffer 312 for programming. For example, 532 bytes of data could be input in one embodiment. That data is latched in the appropriate registers for the selected bit lines. In some embodiments, the data is also latched in a second register for the selected bit lines to be used for verify operations. At step 356, a "program" command is issued by the controller and input to data input/output buffer 312. The command is latched by state machine 316 via the command latch signal input to command circuits 314.

Triggered by the "program" command, the data latched in step 354 will be programmed into the selected memory cells controlled by state machine 316 using the stepped pulses of FIG. 6 applied to the appropriate word line. At step 358, Vpgm, the programming pulse voltage level applied to the selected word line, is initialized to the starting pulse (e.g., 12V) and a program counter PC maintained by state machine 316 is initialized at 0. At step 360, the first Vpgm pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to $V_{DD}$ to inhibit programming.

At step 362, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 364, it is checked whether all of the data latches are storing logic "1." If so, the programming process is complete and successful because all selected memory cells were programmed and verified to their target states. A status of "PASS" is reported at step 366.

If, at step 364, it is determined that not all of the data latches are storing logic "1," then the programming process continues. At step 368, the program counter PC is checked against a program limit value. One example of a program limit value is 20, however, other values can be used in various implementations. If the program counter PC is not less than 20, then it is determined at step 369 whether the number of bits that have not been successfully programmed is equal to or less than a predetermined number. If the number of unsuccessfully programmed bits is equal to or less than the predetermined number, then the programming process is flagged as passed and a status of pass is reported at step 371. The bits that are not successfully programmed can be corrected using error correction during the read process. If however, the number of unsuccessfully programmed bits is greater than the predetermined number, the program process is flagged as failed and a status of fail is reported at step 370. If the program counter PC is less than 20, then the Vpgm level is increased by the step size and the program counter PC is incremented at step 372. After step 372, the process loops back to step 360 to apply the next Vpgm pulse.

The flowchart of FIG. 7 depicts a single-pass programming method as can be applied for binary storage. In a two-pass programming method as can be applied for multi-level storage, for example, multiple programming or verification steps may be used in a single iteration of the flowchart. Steps 358-372 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

Figure 8:
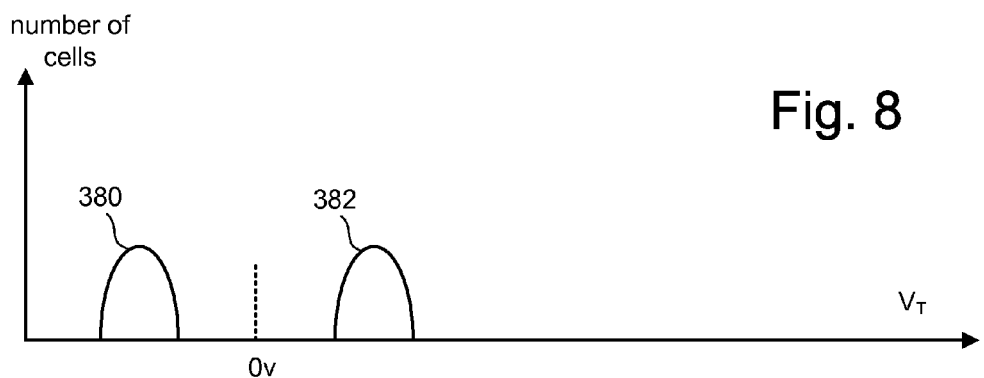
FIG. 8 depicts exemplary threshold distributions of a group of memory cells.

At the end of a successful program process, the threshold voltages of the memory cells should be within one or more distributions of threshold voltages for programmed memory cells or within a distribution of threshold voltages for erased memory cells. FIG. 8 illustrates threshold voltage distributions for a memory cell array when each memory cell stores one bit of data. FIG. 8 shows a first distribution 380 of threshold voltages for erased memory cells and a second distribution 382 of threshold voltages for programmed memory cells. In one embodiment, the threshold voltage levels in the first distribution 380 are negative and correspond to logic "1" while the threshold voltage levels in the second distribution 382 are positive and correspond to logic "0."

Figure 9:
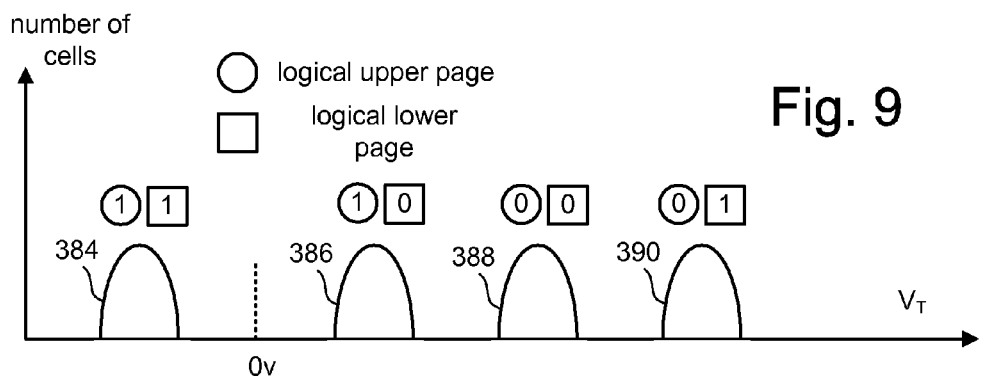
FIG. 9 depicts exemplary threshold distributions of a group of memory cells storing two bits of data.

FIG. 9 illustrates exemplary threshold voltage distributions for a memory cell array when each memory cell stores two bits of data in four physical states. Distribution 384 represents a distribution of threshold voltages of cells that are in an erased state (storing "11"), having negative threshold voltage levels. Distribution 386 represents a distribution of threshold voltages of cells that are in a first programmed state, storing "10." Distribution 388 represents a distribution of threshold voltages of cells that are in a second programmed state, storing "00." Distribution 390 represents a distribution of threshold voltages of cells that are in a third programmed state, storing "01." Each of the two bits stored in a single memory cell, in this example, is from a different logical page. That is, each bit of the two bits stored in each memory cell carries a different logical page address. The bit displayed in the square corresponds to a lower page. The bit displayed in the circle corresponds to an upper page. In one embodiment, the logical states are assigned to the sequential physical states of memory cells using a gray code sequence so that if the threshold voltage of a floating gate erroneously shifts to its nearest neighboring threshold voltage state range, only one bit will be affected. In order to provide improved reliability, it is preferable for the individual distributions to be tightened (distribution narrowed), because the tighter distribution brings a wider read margin (distance between adjacent state threshold distributions).

Of course, if the memory is operated with more than four physical states then there will be a number of threshold voltage distributions within the defined voltage threshold window of the memory cells that is equal to the number of states. Further, although specific bit patterns have been assigned to each of the distributions or physical states, different bit patterns may be assigned.

Memory cells are erased in one embodiment by raising the p-well to an erase voltage (e.g. 20 volts) and grounding or applying 0 volts to the word lines of a selected block while the source and bit lines are floating. FIG. 10 depicts exemplary bias conditions for performing an erase operation. Due to capacitive coupling, the unselected word lines (e.g., those in unselected, not to-be-erased blocks), bit lines, select lines, and common source lines are also raised to a high positive potential (e.g., 20V). A strong electric field is thus applied to the tunnel oxide layers of memory cells of a selected block and the data of the selected memory cells is erased as electrons of the floating gates are emitted to the substrate. Erasing refers to lowering the threshold voltage of a memory cell by transferring electrons out of its floating gate. As sufficient electrons are transferred from the floating gate to the p-well region, the threshold voltage of a selected cell becomes negative. Once the threshold voltage reaches a predetermined sufficiently low value, the memory cell can be regarded as erased and the erase process deemed completed or successful. Thus, erasing a memory cell refers to lowering the threshold voltage of a memory cell and does not imply complete or successful erasing thereof. Erasing can be performed on the entire memory array, one or more blocks of the array, or another unit of cells. The erase voltage signal $V_{erase}$ is typically applied as a series of erase voltage pulses, with an erase verification operation being carried out in between each pulse. If the unit of cells being erased is not verified as erased after application of an erase voltage pulse, another erase voltage pulse can be applied to the p-well region. In some embodiments, the peak value of the erase voltage is increased for each subsequent pulse (e.g., in 1V increments from 16V to 20V).

FIG. 11 is a graph depicting the voltage at various portions of a NAND string during application of a single erase voltage pulse for a typical erase operation (e.g., under the bias condition of FIG. 10). The example of FIG. 11 illustrates an ideal case, ignoring inter-gate capacitive charge coupling as hereinafter described. Curve 410 depicts the voltage of the p-well region which receives erase voltage signal $V_{erase}$. The erase voltage pulse causes the p-well to ramp up to 20V and then back to 0V. Curves 414 and 412 depict the control gate voltage and floating gate voltage of a memory cell of the string. Before the erase voltage pulse is applied, the floating gate voltage depends on the programmed state of the memory cell and is typically lower than 0V. In FIG. 11, a value of −1V is assumed for the floating gate voltage before the first erase voltage pulse. The control gate voltage 414 remains at 0V throughout the erase operation while the floating gate voltage 412 rises in proportion to the p-well voltage. The floating gate is capacitively coupled across the tunnel dielectric region to the p-well. In many NAND string implementations, the capacitive coupling ratio between the floating gate of a memory cell and the p-well region is about 40-50%. Accordingly, floating gate voltage 412 rises in about a 0.5:1 ratio (when the coupling ratio is 50%) with the p-well voltage to a voltage of about 9V. The resulting erase potential, the potential between the cell's floating gate and the p-well region, is given below the graph of FIG. 11. The erase potential is equal to the difference between the p-well voltage ($V_{erase}$=20V) and the floating gate voltage ($V_{FG}$=9V). For the scenario depicted in FIG. 11, the erase potential is equal to about 11V at the beginning of the first erase voltage pulse. Note that the erase potential changes during the actual erase voltage pulse as electrons are transferred from the floating gate to the p-well. As a result, when the p-well returns to 0V after the erase voltage pulse, the floating gate voltage will be different than before the erase voltage pulse was applied. Typically, the floating gate voltage will be positive after the first erase voltage pulse, corresponding to a negative (erased) threshold voltage of the memory cell.

The actual voltage levels within a NAND string will be different than described with respect to the ideal case of FIG. 11 in most cases. Because of capacitive charge coupling between neighboring floating gates and between select gates and neighboring floating gates, different memory cells of a NAND string may experience different erase potentials under application of the same erase bias conditions.

Figure 12:
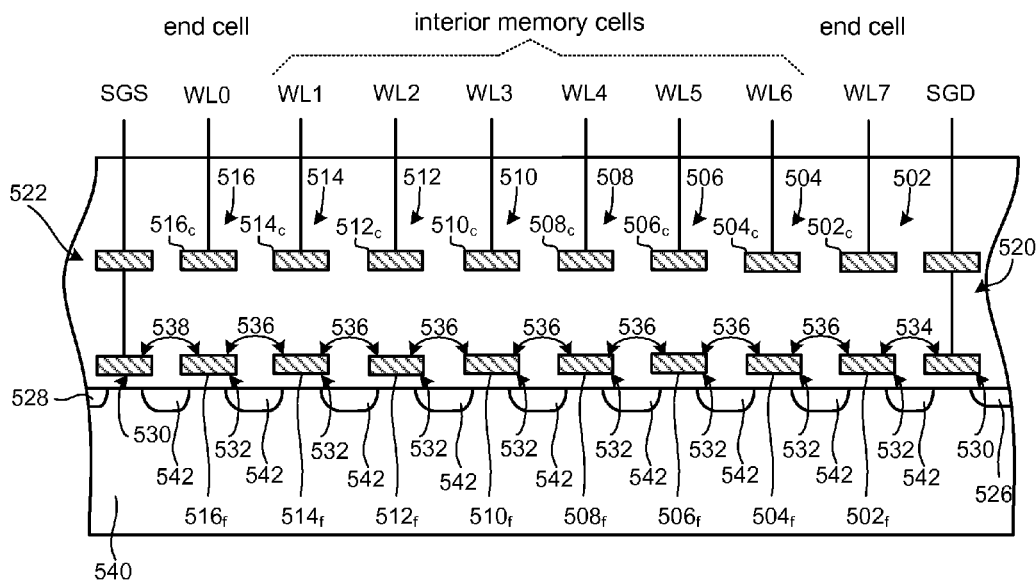
FIG. 12 is a cross sectional view of a NAND string depicting various capacitively coupled voltages within the NAND string.

FIG. 12 provides a cross-sectional view of a NAND string including 8 memory cells. Although embodiments are presented with respect to FIG. 12 and an 8 cell NAND structure, the present invention is not so limited and can be used in accordance with numerous NAND structures including fewer or more than 8 memory cells (e.g., 4, 12, 16, or more). As depicted in FIG. 12, the memory cells of the NAND string are formed in p-well region 540. Each memory cell (502, 504, 506, 508, 510, 512, 514, and 516) includes a stacked gate structure that consists of the control gate (502c, 504c, 506c, 508c, 510c, 512c, 514c, and 516c) and a floating gate (502f, 504f, 506f, 510f, 512f, 514f, and 516f). The floating gates are formed on the surface of the p-well on top of an oxide or other dielectric composite film. The control gate is above the floating gate, with an oxide or other isolating dielectric layer separating the control gate and floating gate. The control gates of the memory cells connect to or form word lines WL0, WL1, WL2, WL3, WL4, WL5, WL6, and WL7. N+ diffused regions 542 are shared between neighboring cells whereby the cells are connected to one another in series to form a NAND string. These N+ diffused regions form the source and drain of each of the cells. N+ diffused region 526 connects to the bit line for the NAND string, while N+ diffused region 528 connects to a common source line for multiple NAND strings. The select gates 520 and 522 are formed of the same structure as the memory cells, however, the gate regions are electrically connected.

Because of capacitive coupling, the floating select gates 522 and 520 are raised to a high positive potential when a high erase voltage is applied to the p-well during erase operations. The erase voltage applied to the p-well, or some portion thereof, couples from the well region to each of the select gates. About 90-100% of the p-well voltage can be expected to couple to each select gate in many NAND structures. Therefore, if an erase voltage pulse of 20V is applied to the p-well, the voltage on each select gate will rise about 18V-20V to a voltage of 18V-20V. In FIG. 12, the coupling from p-well 540 to select gates 522 and 520 is illustrated by arrows 530. Although to a lesser degree, a similar coupling effect is also experienced by each of the memory cells of the string. The coupling between the p-well and the floating gate of a memory cell is typically about 40-50%. Each floating gate is also coupled to its corresponding control gate with a coupling of about 50-60%. To a smaller extent, each floating gate is coupled to neighboring floating gates and control gates. All the different couplings add up to a total of 100%. Assuming a 50% coupling from p-well to floating gate, the floating gate voltage of each memory cell is raised about 10V under application of a 20V erase voltage pulse. This coupling effect is illustrated by arrows 532. The voltage coupled to each memory cell's floating gate effects the $V_{erase}$ potential created across the tunnel oxide layer. For example, an erase potential of about 11V (20V-9V) is created under application of a 20V erase voltage pulse to the p-well for a memory cell having a floating gate voltage of −1V prior to erasing.

Each memory cell of the string will experience some capacitive charge coupling from neighboring memory cells and/or transistors. This coupling can affect the potential of a cell's floating gate and consequently, the erase potential for the cell. The end memory cells (e.g., memory cells 502 and 516 in FIG. 12) of the NAND string—those connected to the first and last word lines (end word lines) of the NAND string and adjacent to the select gates of the NAND string—will experience capacitive charge coupling from the neighboring select gates. In FIG. 12, this capacitive coupling is depicted by arrow 534 from select gate 520 to floating gate 502f of memory cell 502 and by arrow 538 from select gate 522 to floating gate 516f of memory cell 516. The voltage coupled to memory cells 502 and 516 will decrease the electric field present across those cells' tunnel dielectric regions (e.g., tunnel oxide) in proportion to the amount of voltage at the respective select gate.

The coupling represented by arrows 538 and 534 occurs in both directions because during an erase operation, the select gates are in a floating state as well. As a result, the floating gate voltage of memory cells 516 and 502 will have some influence on the voltage on the select gates 522 and 520. However, the coupling from floating gate to select gate is much smaller than the coupling from the p-well to the select gates, and thus, the select gate voltage is determined almost completely by the p-well voltage.

In many NAND implementations, capacitive coupling from the select gates to the floating gates of the end memory cells of a NAND string can be expected to be on the order of about 2% to 5%. If an erase voltage of 20 volts is applied to the p-well region, each select gate's voltage will rise about 18V with 90% p-well to select gate coupling. Subsequently due to the 2-5% coupling from select gate to neighboring floating gate, the voltage on the neighboring floating gates (e.g., 516f and 502f) will rise about 0.4-1V. The resulting voltage across the tunnel oxide of the end memory cells of the string will be about 0.4 to 1V less than that for the ideal case shown in FIG. 11. Note that the above mentioned capacitive coupling can vary largely depending on the physical dimensions of the memory cells and select gates, the spacing between memory cells and select gates, and the dielectric properties of the materials used in constructing such components as the tunnel dielectric, dielectric between control and floating gates, and dielectric between select gates and memory cells. In some cases, for example, the above mentioned coupling may be larger or smaller than the above mentioned 2-5% range.

In addition to coupling between neighboring floating gates, another factor is coupling between the floating gate and neighboring word lines or control gates. This coupling may also be on the order of 2-5%, but may be smaller or larger depending on the dimensions and shape of the memory cells. In some cases, particularly where the physical distance between the select gates and neighboring memory cells is similar to the distance between two interior memory cells, the coupling from the select gate to the neighboring floating gate will be in a similar range as the coupling from a neighboring control gate (word line) and floating gate. During an erase operation, however, as the select gate is biased differently in comparison with the control gates and floating gates, the floating gate voltage of the end memory cells will be higher than that of the interior memory cells and thus, the erase potential will be lower for the end memory cells as hereinafter described.

Figure 13:
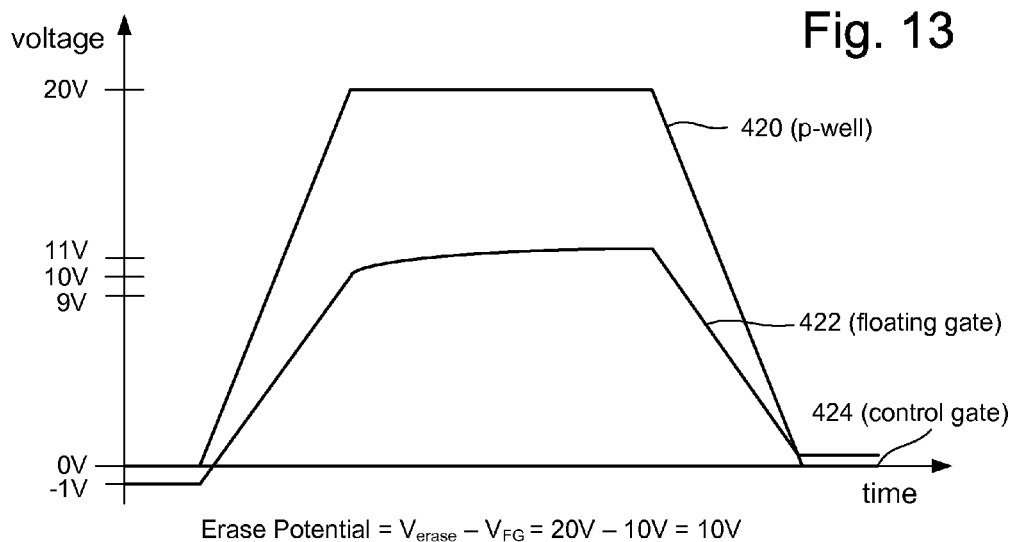
FIG. 13 is a graph depicting various voltages of the end memory cells of a NAND string during an erase operation.

FIG. 13 depicts the p-well voltage 420, floating gate voltage 422, and control gate voltage 424 for a typical end memory cell of a NAND string during application of a single erase voltage pulse for an erase operation under the bias conditions of FIG. 10. The p-well voltage 420 rises from 0V to a peak value of 20V and then back to 0V. The control gate voltage 424 remains at 0V since the word lines connected to each memory cell are supplied with 0V. As with all the cells, the floating gates of the end memory cells are capacitively coupled to the p-well region on the order of about 40-50%. As the p-well region voltage increases to 20V, this capacitive coupling causes the floating gate voltage to rise about 10V when 50% coupling is assumed. The end memory cells additionally have a portion of the voltage at the neighboring select gate coupled to them. Thus, the voltage on these floating gates will not only be increased in proportion with the p-well voltage that is capacitively coupled thereto, but will also be increased due to the 2-5% coupling from the select gates. In FIG. 13, it is assumed that the coupling from the select gates adds an additional 1V to the floating gate voltage. Accordingly, the floating gate voltage 422 rises to a maximum value of 10V at the beginning of the erase voltage pulse as opposed to the maximum value of 9V for the ideal case depicted in FIG. 11. The erase potential across the tunnel dielectric region for the end memory cells is given below the graph of FIG. 13. The erase potential at the beginning of the erase voltage pulse is about 10V, or about 1V less than the 11V erase potential for the ideal case.

The memory cells of a NAND string that are not adjacent to a select gate (i.e., all but the end memory cells of a NAND string) may be referred to herein as interior memory cells of the string. In FIG. 12, the interior memory cells of the NAND string are memory cells 504, 506, 508, 510, 512, and 514. Although the interior memory cells will experience capacitive coupling from neighboring floating gates that will decrease their erase potential (discussed hereinafter), it is of a lesser degree than that of the end memory cells. Thus, the interior memory cells will behave substantially as the ideal case described earlier and have an erase potential of about 11V (assuming that the cells were in a programmed state with a floating gate voltage of about −1V before the erase voltage pulse). Because of the lower potential across the tunnel oxide layers of the end memory cells compared to the interior memory cells, the end memory cells will erase slower and not be as deeply erased (will have fewer electrons transferred from their floating gates) as the interior memory cells after application of one or more erase voltage pulses.

Memory cells of a NAND string are verified as erased when the net positive charge on the floating gate is above a predetermined level (threshold voltage below a predetermined level). Because of the additional coupling to the floating gates of the end memory cells, the overall time for an erase operation is increased in order to sufficiently erase these end memory cells. The interior memory cells may be sufficiently erased after application of a number N erase voltage pulses, while the end memory cells of the NAND string may not be sufficiently erased until application of N+1 or more erase voltage pulses.

FIG. 12 illustrates an additional capacitive coupling effect between the floating gates of individual memory cells of the NAND string by arrows 536. For example, the coupling between neighboring floating gates on WL0 and WL1 may be on the order of 2-5%, but may be smaller or larger depending on the dimension and shape of the memory cells. As a result, a voltage present on the floating gate of memory cell 516 will influence the voltage of the floating gate of memory cell 514 and vice versa. A similar coupling will be present between the floating gates of memory cells 514 and 512, connected to WL2, and so on. This coupling exists in both directions, as indicated by the double head on arrows 536. These coupling effects will be seen among all memory cells of the NAND string at various levels but the impact of the coupling will be less than that on the end memory cells as the bias voltages on the neighboring control gates and floating gates are different from the bias condition on the select gates. During the presence of the erase voltage pulse, the voltage of each floating gate is significantly less than the voltage present at the select gates. Thus, the amount of voltage induced in each floating gate due to coupling between the floating gates of individual memory cells will be less than the voltage that is induced in the floating gates of the end memory cells due to coupling to the adjacent select gates. Nevertheless, each memory cell of the NAND string can be expected to have a slightly differing net charge present at its floating gate and a correspondingly different erase behavior due to such coupling.

Figure 14A:
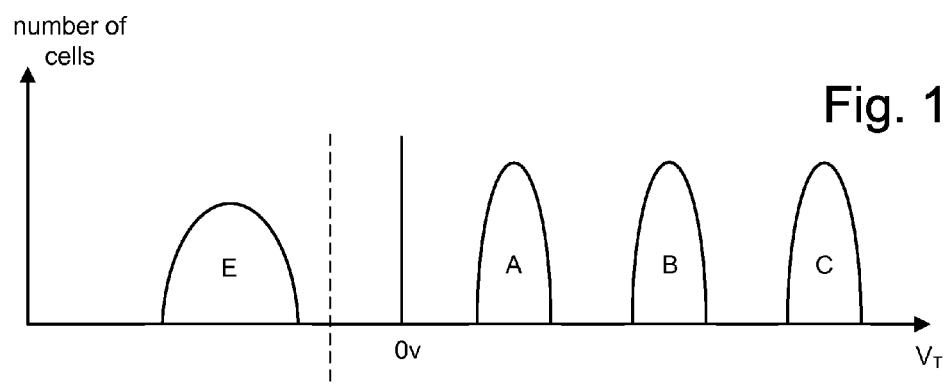
FIGS. 14A and 14B depict exemplary individual threshold voltage distributions for the end and interior memory cells of a NAND string after completing an erase operation.
Figure 14B:
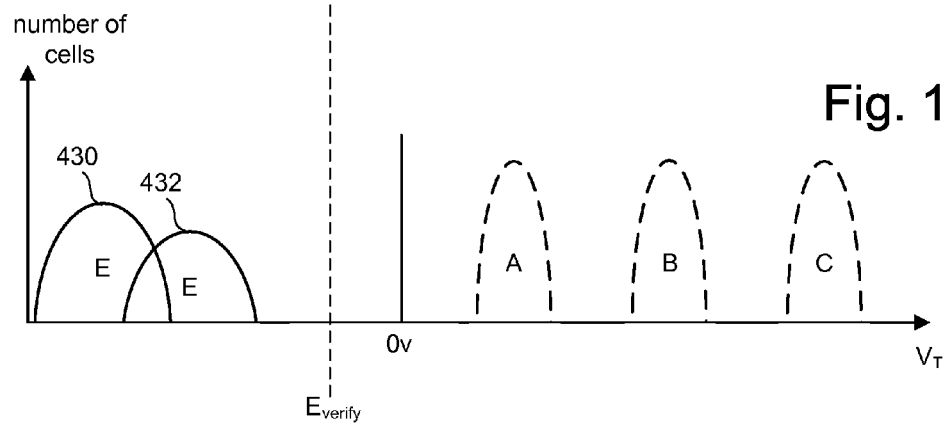

FIG. 14A shows the erased (E) and programmed (A,B,C) threshold voltage $V_T$ distributions of a four state or four level memory device after data has been written into the memory array. FIG. 14B depicts the same four state memory device after an erase operation has been completed. The threshold voltage distributions for the memory cells of the interior word lines and end word lines are depicted separately. Distribution 430 shows the threshold voltage distribution for the interior word lines, which are erased deeper than the end word lines, depicted by distribution 432. In some NAND memory device implementations, the interior memory cells will be about 0.5-1V more deeply erased than the end memory cells because of capacitive charge coupling from the select gates. The memory cells of both the interior and end word lines are in general erased deeper than required. To guarantee that all or most memory cells can be erased with one erase voltage pulse after a number of write/erase cycles, the selected size of the first erase voltage pulse is generally larger than required to erase all the cells of a fresh device (not having undergone many write/erase cycles) in one pulse. Thus, a fresh memory device may have threshold voltage distributions as shown in FIG. 14B after undergoing an erase operation.

When erase verification of a number of memory cells is performed at a NAND string level or higher (e.g., on a block or other unit of strings), disparate erase times or behavior amongst memory cells can lead to over stressing and over erasing certain memory cells. For example, the interior memory cells of a NAND string may be over erased while attempting to sufficiently erase the end memory cells of the string. As previously described, the interior memory cells will erase faster than the end memory cells. If verification is performed at a NAND string level, the NAND string will continue to receive an erase voltage pulse at the p-well until each memory cell of the string is erased. Therefore, even though the interior memory cells may sufficiently erase after a lower number of erase voltage pulses than the end memory cells, the interior memory cells will receive additional erase voltage pulses until each memory cell of the string is verified as erased.

A greater stress is placed on the interior memory cells than is necessary because of over erasure. Over erasing the interior memory cells because of the slower erase times of the end memory cells can decrease the life span of the interior memory cells and an overall non-volatile memory system. As understood in the art, application of a large potential across the tunnel oxide layer of a transistor stresses the oxide material. Application of a high enough potential across the tunnel oxide layer or application of a lower potential a number of times can eventually lead to a breakdown of the oxide layer.

Disparate erase behavior between memory cells can also lead to increased erase operation times because of additional operations that may be performed to change the threshold voltage of a memory cell after being erased. When flash memory cells are erased, the goal is that all erased cells have a negative threshold voltage within a predefined range of negative threshold voltages. As illustrated, however, the erase process may result in some cells having negative threshold voltages below the predefined range. Memory cells having a threshold voltage that is too low may not subsequently program properly or may cause other cells to not program properly (e.g., by increasing the probability that program disturb occurs). Thus, over-erased devices will often undergo what is called soft programming. Memory cells with threshold voltages of significantly lower values within the predefined range will receive a small amount of programming so that the threshold voltage is raised to be within the predefined range. The soft program process requires an additional operation to be performed and decreases memory performance due to increased erase times as soft programming is usually considered part of the erase operation.

In accordance with one embodiment, a set of memory cells such as a NAND string is erased by applying erase voltages to the set of memory cells during discrete intervals under different bias conditions. The different bias conditions used for each interval are selected to reduce or eliminate differences between the erase rates of individual memory cells within the string.

An underlying cause of variances in the erase rates of memory cells within a common NAND string arise from the different bias conditions of the transistors neighboring particular memory cells of the string. Consider the end memory cells previously described. The select gate lines for the drain and source side select gates of the string neighbor the end memory cells and are floating during application of the erase voltage. By contrast, the word lines connected to each of the memory cells in the string are at 0V to create the necessary potential to draw electrons out of the corresponding floating gates. Because the end memory cells each have one neighboring transistor that is floating while the remaining memory cells each have both of their neighboring transistors (adjacent memory cells) at 0V, the erase potential for the end memory cells is less than that of the remaining memory cells because of the capacitive coupling effects already described.

The disparate erase behaviors that arise from this unique bias situation during erase can be reduced or eliminated by providing similar bias conditions to the neighboring transistors of each memory cell when the cells are erased. If each memory cell of the string has neighboring transistors at the same bias when subjected to erase, the individual cells should exhibit more uniform erase behavior. They will each experience similar capacitive coupling effects from their neighboring transistors, as opposed to the different effects that result from the aforementioned techniques that erase each cell at the same time. The erase behaviors of different memory cells are effectively normalized by facilitating an approximately equal amount of charge coupling to each memory cell from its neighbors during erase. This results in a similar erase potential for each memory cell of the string and a similar amount of charge transferred from each cell when an erase voltage is applied.

In one embodiment, the memory cells of a NAND string are divided into logical groupings of cells that are erased during discrete time intervals. The bias conditions applied to the string during each interval are different so that the erase behavior of the individual cells can be normalized. For example, a first subset of cells can be erased during a first time interval. Each transistor neighboring one or more cells in the first subset of cells is biased the same during the first interval to facilitate similar coupling scenarios within the string and consequently, similar erase rates amongst each cell in the first subset. During a second time interval, a second subset of cells can be erased. Each transistor neighboring one or more cells in the second subset is biased the same as the transistors neighboring one or more cells in the first subset during the first time interval. This will facilitate more consistent erase rates between cells in the second subset, between cells in the first subset, as well as between cells in the first and second subsets.

In one embodiment, the memory cells being erased do not have each neighboring transistor at the same bias but the net bias or coupling effects on each memory being erased are still made equal. For example, each memory cell being erased could have a first neighboring transistor at a first bias and a second neighboring transistor at a second bias. If each memory cell, when it is subjected to erase, has both neighbors biased in this fashion, the net bias or coupling effects on each cell when being erased will be the same despite the fact that both neighbors for each individual cell are not similarly biased. An important feature is that for each memory cell, its two most immediate neighboring transistors be biased to create a net bias or coupling effect on the memory cell being erased that is about equal when compared to each other memory cell in the string.

In one embodiment, an erase voltage pulse can be applied to the well region of a NAND string of memory cells with a first group of memory cells from the set biased for erase and a second group of memory cells from the set biased to inhibit erase. A second erase voltage pulse can then be applied with the second group biased for erase and the first group biased to inhibit erase. The first and second groups are chosen so that the erase potentials created across the tunnel dielectric regions of each memory cell in the first subset during the first pulse are about equal, so that the erase potentials created across the tunnel dielectric regions of each memory cell in the second subset during the second pulse are about equal, and so that the erase potentials for the cells of the first subset during the first pulse are about the same as the erase potentials for the cells of the second subset during the second pulse.

FIG. 15 is table showing the bias conditions for a NAND string of non-volatile storage elements during an erase operation in accordance with one embodiment. FIG. 15 depicts one set of bias conditions. Other bias conditions can be used and different groupings of cells made. The set of memory cells that forms the NAND string is divided into individual subsets of memory cells that are erased during discrete time periods. The word lines that connect to the memory cells of the string are divided into subsets that correspond to the subsets of memory cells. Word lines WL0-WL$i$ are divided into a first subset of word lines (subset A) that connect to a first subset of memory cells and a second subset of word lines (subset B) that connect to a second subset of memory cells. While reference may be made to a single NAND string for clarity of description when describing FIG. 15, it will be appreciated that in a typical NAND flash memory implementation, each word line connects to one memory cell from more than one NAND string (e.g., one memory cell from each NAND string in a block of memory cells as shown in FIG. 5). Accordingly, it will be appreciated that the described operations can take place in parallel for many NAND strings.

The first subset of word lines includes word line WL0, the word line adjacent to the source side select gate line SGS for the NAND string, and every other word line following WL0 in the set as one proceeds from the source side of the string to the drain side of the string. Every other word line refers to the word lines encountered while proceeding sequentially from WL0 through the set of word lines if the next word line adjacent to the current word line is skipped and the following word line adjacent to the skipped word line is selected. In the example of FIG. 15, the first subset of word lines, subset A, includes word lines WL0, WL2, WL4 ... WL$n$-1. The second subset of word lines includes word line WL1, the word line adjacent to word line WL0, and every other word line thereafter in the set as one proceeds from the source side of the string to the drain side of the string. In the example of FIG. 15, the second subset of word lines, subset B, includes word lines WL1, WL3, WL5. WL$n$. For a set of word lines that is connected to one or more NAND strings and includes a first word line WL0 adjacent to a source side select gate line, the first subset of word lines can be defined by a word line sequence WL2$i$, where $i$ is equal to an integer. The second subset of word lines can then be defined by a word line sequence WL2$i$+1, where $i$=an integer.

Each of the subsets of memory cells, which directly correspond to one of the subsets of word lines, are separately erased at different times during the erase operation. Column 440 depicts the bias conditions for a first erase sub-operation in which the memory cells of subset A are erased. Column 442 depicts the bias conditions for a second erase sub-operation in which the memory cells of subset B are erased. The bias conditions in column 440 are applied during a first interval of time to enable the memory cells of subset A to be erased while inhibiting the memory cells of subset B from being erased. Each word line of subset A is supplied with 0V and each word line of subset B is allowed to float during this first interval. With an erase voltage pulse applied to the p-well region for the NAND string, a large potential is created across the tunnel dielectric region of each memory cell in subset A and electrons are drawn out of the floating gates of those cells. The floating potential of the word lines in subset B causes those word lines to rise in proportion to the erase voltage pulse and thus, inhibits a large potential from being created across the tunnel dielectric region of the memory cells in subset B.

The bias conditions in column 442 are applied during a second interval of time to enable the memory cells of subset B to be erased while inhibiting the memory cells of subset A from being erased. The word lines of subset B are supplied with 0V and the word lines of subset A are allowed to float. When the erase voltage pulse is applied to the p-well region under these bias conditions, a large potential is created across the tunnel dielectric region of each memory cell in subset B while a large potential is inhibited from being created across the tunnel dielectric region of the memory cells in subset A. Accordingly, electrons will be drawn out of the memory cells in subset B, but not subset A, during this second sub-operation.

Using the sub-operation approach of FIG. 15, each memory cell will have similarly biased neighboring transistors when it is erased. During the first erase sub-operation depicted in column 440, each memory cell of subset A has both of its most immediately adjacent transistors at a floating potential when the erase voltage pulse is applied. Similarly, during the second erase sub-operation depicted in column 442, each memory cell of subset B has both of its most immediately adjacent transistors at a floating potential when the erase voltage pulse is applied. Even the end memory cells of WL0 (subset A) and WL$n$ (subset B) have both neighboring transistors at the same potential. The source select gate line and word line WL1 are both floating when the memory cell at WL0 is being erased. The drain select gate line and word line WL$n$-1 are both floating when the memory cell at WL$n$ is being erased. Because every memory cell has similarly biased neighboring transistors when it is erased, any change in erase potential caused by capacitive coupling from neighboring transistors should be similar for each memory cell of the string. Consequently, each memory cell within the string will exhibit more consistent erase rates when compared with the erase rates of each memory cell during traditional erase operations.

Thus, the end memory cells will not erase at a slower rate when compared with the interior memory cells as often occurs during traditional erase operations. The unique erase characteristics of the end memory cells are reduced or eliminated by ensuring that every memory cell of the string has similarly biased neighboring transistors when it is subjected to erase. In the embodiment of FIG. 15, this is accomplished by forcing the neighboring transistors of every memory cell selected for erase to a floating potential when erasing those selected memory cells. When subset A is enabled for erase, the two most adjacent transistors to each memory cell in subset A are each biased to a floating potential while the erase voltage pulse is applied. When subset B is enabled for erase, the two most adjacent transistors to each memory cell in subset B are biased to a floating potential while the erase voltage pulse is applied. Because each memory cell has its neighboring transistors biased the same when being erased, each memory cell will exhibit a similar erase rate.

FIGS. 16A-16H depict the voltages at various portions of a NAND string during an erase operation according to the techniques and bias conditions of FIG. 15. FIG. 16A depicts the erase voltage signal during a first erase voltage pulse applied under the bias conditions of column 440 to erase the cells of subset A and a second erase voltage pulse applied under the bias conditions of column 442 to erase the cells of subset B.

FIG. 16B depicts the p-well voltage which rises to a peak value of 20V during application of the first erase voltage pulse, declines back to 0V, and then rises again to a peak value of 20V during application of the second erase voltage pulse. Application of the first erase voltage pulse corresponds to the time interval during which the bias conditions of column 440 are applied to erase the memory cells of subset A and application of the second erase voltage pulse corresponds to the time interval during which the bias conditions of column 442 are applied to erase the memory cells of subset B.

FIGS. 16C and 16F depict the voltage signal or condition applied to the word lines of subset A and subset B, respectively. FIG. 16D depicts the resulting control gate voltage for a memory cell in subset A, FIG. 16E depicts the resulting floating gate voltage for a memory cell in subset A, FIG. 16G depicts the resulting control gate voltage for a memory cell in subset B, and FIG. 16H depicts the resulting floating gate voltage for a memory cell in subset B.

At time $t_1$, the first erase voltage pulse is applied and the p-well voltage for the NAND string begins to rise in accordance therewith. 0V is applied to the word lines of subset A as shown in FIG. 16C. The control gates of each memory cell in subset A will thus remain at 0V as shown in FIG. 16D. The word lines of subset B are allowed to float at time t1, as shown in FIG. 16F, so as to inhibit erasing of the memory cells of subset B. With the word lines of subset A at 0V, the floating gate voltage of a memory cell in subset A (FIG. 16D) will rise in accordance with its coupling ratio to the p-well region. For the exemplary memory cell depicted in FIG. 16E, the floating gate voltage is assumed to be −1V before the first erase voltage pulse is applied, and the coupling ratio between the floating gate and p-well is assumed to be about 50%. Accordingly, the floating gate voltage rises about 10V in response to the 20V rise in the p-well voltage. In addition to the 10V rise in response to the p-well voltage, the floating gate voltage will rise about an additional 2V due to the capacitive coupling effects from its neighboring transistors which are floating. Thus, the floating gate voltage rises to a peak value of 11V at the beginning of application of the erase voltage pulse.

Under the bias conditions of column 440, each memory cell of subset A has both of its neighboring transistors of the NAND string in a floating condition during application of the erase voltage pulse. For example, the memory cell connected to WL0 includes the source side select gate and the memory cell of WL1 as its neighboring transistors. Each of these transistors is floating. As previously described, about 90%-100% of the p-well voltage will couple to the floating select gates when the erase voltage is applied. Continuing under an assumption that 90% of the p-well voltage couples to the select gates, about 18V will couple to the select gates when the erase voltage pulse is applied. If we further assume a coupling ratio of about 5% between a select gate and its neighboring transistor, about 1V will couple to the floating gate of the memory cell at WL0. A similar coupling will occur between the memory cell at WL1 and the memory cell at WL0 when the erase voltage is applied. Since the memory cell at WL1 is floating, about 18V will couple to it from the p-well and about 1V of this 18V will couple to the memory cell at WL0. Consequently, the floating gate voltage for the memory cell at WL0 will rise an additional 2V because of capacitive coupling from its neighboring transistors.

By forcing both neighboring transistors to a floating condition, the increase in voltage at the floating gate of a memory cell being erased is about twice the increase in voltage caused at the end memory cells by the floating select gates in traditional erase operations. According to embodiments as depicted in FIGS. 15 and 16, however, the 2V rise in floating gate voltage is the same for every memory cell in subset A because both transistors neighboring each of these cells will be floating when the erase voltage pulse is applied. For example, the memory cell at WL2 (also in subset A) will have its floating gate voltage rise 2V due to capacitive coupling between it and the floating gates of the memory cells at word lines WL1 and WL3. The resulting erase potential for every memory cell in subset A is about 9V, which is equal to the difference between the p-well voltage (20V) and the voltage (11V) at the floating gate of the memory cells of subset A during the erase voltage pulse. If we assume a −1V starting floating gate voltage, the floating gate voltage when the pulse is applied is equal to the sum of the beginning floating gate voltage (−1V), the increase in floating gate voltage due to capacitive coupling with the p-well (10V), and voltages resulting from coupling with a neighboring transistor, which in this case include 1V from each neighbor. Thus, the erase potential is equal to about 9V (20V−(−1V+10V+2V) for each memory cell in subset A. For a memory cell beginning with a −1V starting floating gate voltage, the resulting floating gate voltage after application of a single erase voltage pulse is about 1V as shown at time t3. Other memory cells will start with different floating gate voltages depending on the state they are in at the start of the erase operation.

The memory cells of subset B are inhibited from being erased because of the floating condition provided to their corresponding word lines between time t1 and t3. As shown in FIG. 16F, the word lines of each memory cell in subset B are floated at time t1, when the erase voltage pulse begins to be applied. With the word lines in subset B floating, the control gates of the memory cells in subset B are strongly coupled to the p-well region. Thus, the control gates of each memory cell in subset B will track the p-well voltage due to capacitive coupling. Assuming a 100% coupling ratio in FIG. 16, the control gate voltage of a memory cell in subset B will rise in a 1:1 ratio with the p-well voltage to about 20V as shown in FIG. 16G. In turn, the floating gates of these cells become much more capacitively coupled to the p-well region. The floating gate voltage of each of these memory cells rises in direct proportion (at or about a 90-100% ratio) to the p-well voltage. The memory cell depicted by way of example in FIG. 16H has a floating gate voltage of about −1V prior to the erase operation. Accordingly, it will rise to a peak value of 19V during the erase voltage pulse, before falling back to −1V at time t3.

At time t4, the memory cells of subset B are erased under application of the second erase voltage pulse while inhibiting the memory cells of subset A from being erased by utilizing the bias conditions of column 442 in FIG. 15. At time t4, the second erase voltage pulse is applied to the string. Before or as the second erase voltage pulse is applied, the word lines of the memory cells in subset A are floated to inhibit the memory cells of subset A from being erased. With their word lines floating, the control gates of each memory cell in subset A will rise in a near 1:1 ratio with the p-well voltage to about 20V as depicted in FIG. 16D. The floating gate voltage of each memory cell also becomes strongly capacitively coupled to the p-well and rises in an almost 1:1 ratio with that of the p-well. Since the floating gate voltage of the exemplary memory cell depicted in FIG. 16E was +1V after the first erase voltage pulse, it rises to a peak value of 21V as the erase voltage and p-well rise to 20V. Thus, the memory cell is inhibited from being erased because no large erase potential is created.

The word lines for each memory cell in subset B remain at 0V from time t3 through time t6 to facilitate erasing the memory cells connected thereto. With the word lines at 0V, the control gate voltage of the individual memory cells remains at 0V. The floating gate voltage begins at −1V and rises in proportion to the erase voltage pulse at about a 0.5:1 ratio. Since the exemplary memory cell of FIG. 16H begins at −1V, its floating gate voltage will rise to a peak value of 11V. The voltage rises to 11V due to coupling from the p-well which raises the floating gate voltage from −1V to about 9V. Capacitive coupling between the floating gate of the cell and its two neighbors will raise the floating gate voltage an additional 2V to a peak of 11V. Thus, the erase potential is the same (9V) as that of the cells of subset A. The erase potential is equal to the difference between the 20V p-well voltage and the floating gate voltage, which was shown to be about 11V.

Figure 17:
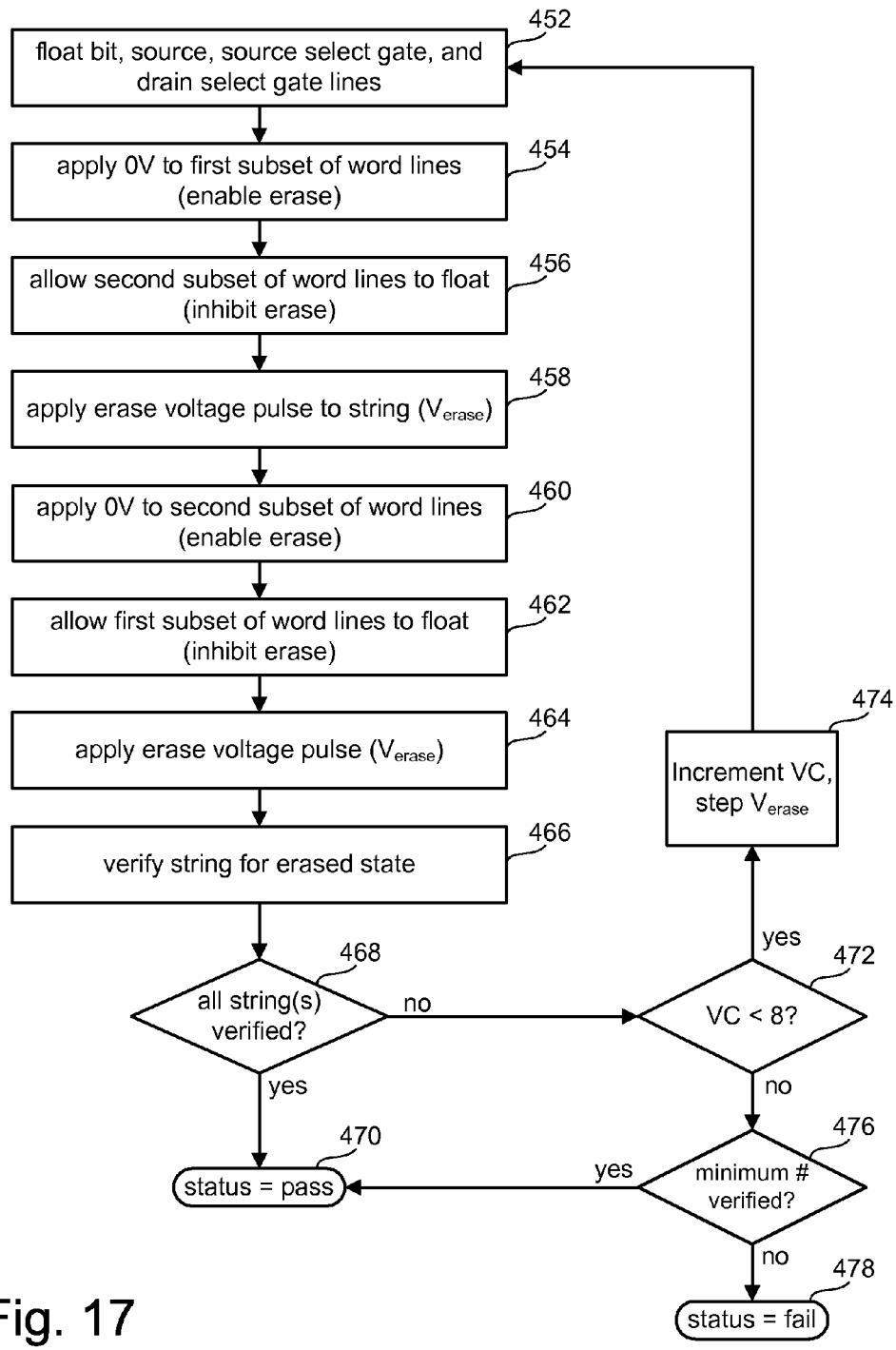
FIG. 17 is a flowchart for erasing a set of non-volatile storage elements in accordance with one embodiment.

FIG. 17 is a flowchart of a method for erasing a string of memory cells in accordance with one embodiment. The bit line, source line, source select gate line, and drain select gate line of the string are allowed to float at step 452. 0V is applied to a first subset of memory cells of the string at step 454 to enable those memory cells to be erased. A second subset of memory cells is allowed to float at step 456 to inhibit those memory cells from being erased. An erase voltage pulse is applied to the string of memory cells at step 458. The erase voltage pulse can be applied to the p-well region to create a large erase potential across the tunnel dielectric regions of the memory cells in the first subset. The floating gates of the memory cells in the second subset will rise in a near 1:1 ratio with the erase voltage and thus, not be erased at step 458.

0V is applied to the second subset of memory cells at step 460 to enable those memory cells to be erased. The first subset of memory cells is allowed to float at step 462 to inhibit those memory cells from being erased. An erase voltage pulse is applied to the string of memory cells at step 464. The erase voltage pulse creates a large erase potential for the memory cells in the second subset but not those in the first subset. As depicted, each memory cell of subset A has both of its neighboring transistors at the same potential, namely floating, when the erase voltage pulse is applied with it enabled for erase. Likewise, each memory cell of subset B has both of its neighboring transistors at the same floating potential when the erase voltage pulse is applied with it enabled for erase. The memory cells within each subset and between each subset should thus exhibit similar erase behavior.

At step 466, the string of memory cells is verified for an erased condition. If all the strings are erased, as determined at step 468, a status of pass for the erase operation is reported at step 470. If all the strings are not erased, it is determined whether a verify counter VC has reached a maximum value (e.g., 8). Various maximum values can be used in various embodiments. If the verify counter has not reached the maximum value, it is incremented at step 474 and the erase voltage $V_{erase}$ is increased by a step size. The erase operation then continues at step 452.

If the verify counter has reached the maximum value, it is determined whether a minimum number of strings are erased at step 476. If so, a pass for the erase operation is reported a step 470. The unsuccessfully erased strings can be managed using error correction codes, for example. If the minimum number of strings has not been erased, a fail for the erase operation is reported at step 478.

Figure 18A:
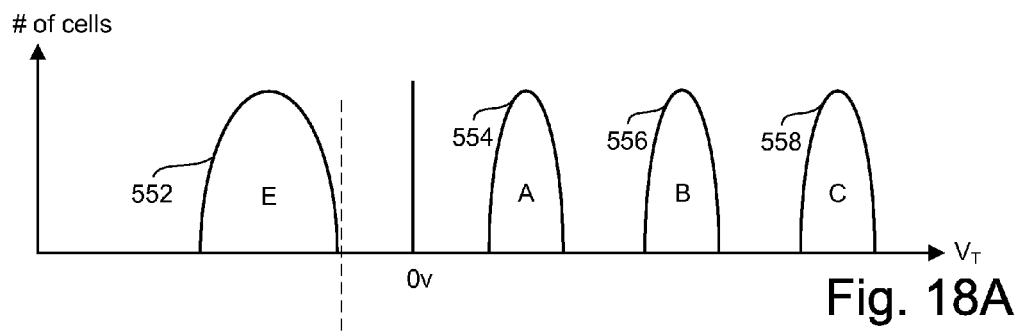
FIGS. 18A-18C depict the threshold voltage distributions of memory cells during an erase operation in accordance with one embodiment.
Figure 18B:
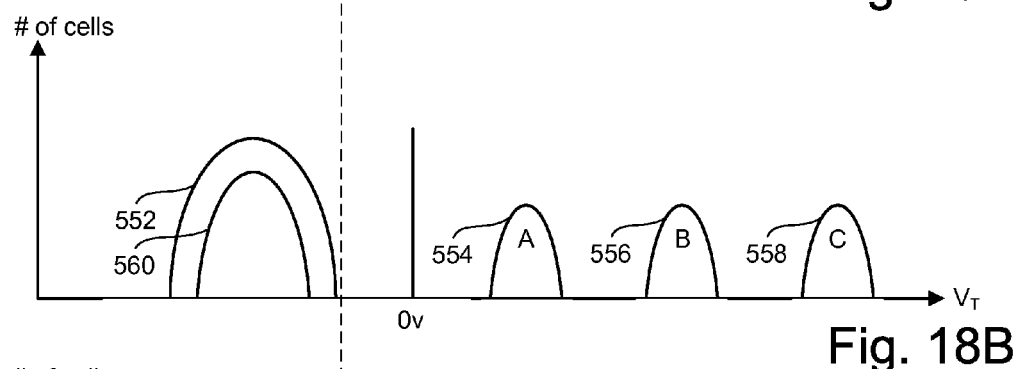
Figure 18C:
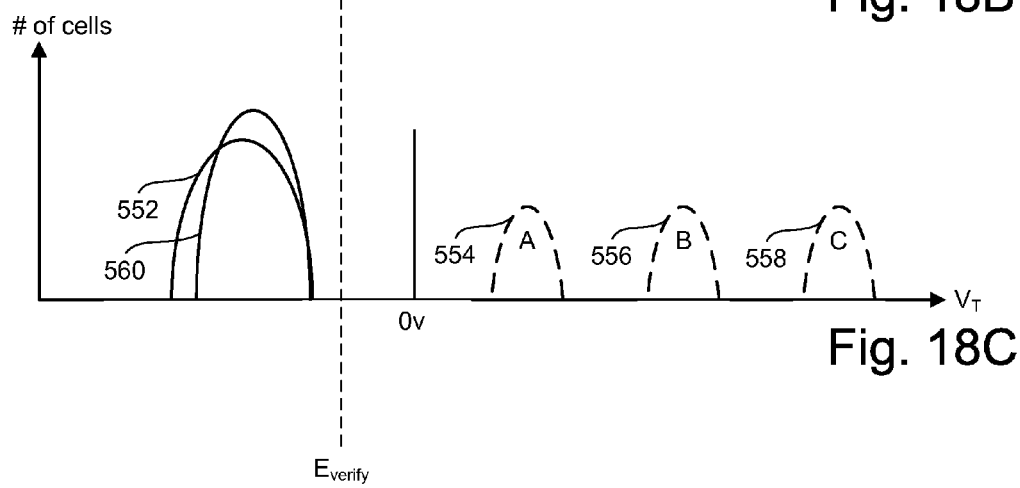

FIGS. 18A-18C depict the threshold voltage distributions for a group of memory cells erased in accordance with embodiments of the technology disclosed herein. The group could include a singe NAND string or multiple NAND strings. FIG. 18A shows the erased threshold voltage distribution 552 and programmed threshold voltage distributions 554, 556, and 558 for a group of four level NAND flash memory cells after data has been written into the array. The distributions in FIG. 18A include the memory cells of both subsets of the NAND string(s) prior to being erased. FIG. 18B depicts the distributions of the group of memory cells after applying an erase voltage pulse to the group while enabling a first subset of memory cells to be erased and inhibiting a second subset of memory cells from being erased. The distributions in FIG. 18B correspond to completion of step 458 in FIG. 17 and also correspond to the application of an erase voltage pulse under the bias conditions of column 440 in FIG. 15 (or column 650 of FIG. 21 hereinafter described). As shown in FIG. 18B, the number of cells in the programmed threshold voltage distributions 554, 556, and 558 has decreased after the first subset is erased. These distributions now only include cells from the second subset since the first subset has been erased. The cells no longer in distributions 554, 556, and 558 are those originally programmed cells in the first subset that have been erased. These cells are now represented by distribution 560, depicting cells that were originally programmed but have now been erased. In FIG. 18B, distribution 560 only includes cells from the first subset since the second subset has not yet been erased. Distribution 552, representing originally erased cells of both the first and second subsets, has widened as a result of the cells in subset A that were already erased being more erased after the first erase voltage pulse is applied.

FIG. 18C shows the threshold voltage distributions of the group of memory cells after applying an erase voltage pulse to the group while enabling the second subset to be erased and inhibiting the first subset from being erased. There are no longer any cells in the programmed threshold voltage distributions 554, 556, and 558. These cells are now represented by distribution 560 which depicts all the memory cells of the group (both first and second subsets) that were originally programmed but have now been erased. As illustrated, distribution 560 is essentially the same as distribution 552, only including more cells. Distribution 552, representing all the memory cells of the group that were originally erased, has its upper edge shift to the left as a result of the memory cells in subset B that were originally erased being erased some more under application of the erase voltage pulse.

In FIGS. 15 and 17, string-level erase verification is depicted. In one embodiment, the individual subsets of memory cells in the string are separately verified for an erased condition. FIG. 19 sets forth the same erase bias conditions in columns 440 and 442 as depicted in FIG. 15. In FIG. 19, however, individual erase verifications for the memory cells of the first subset and the memory cells of the second subset are depicted. Column 446 depicts the bias conditions for verifying whether the memory cells in the first subset are erased while excluding the memory cells of the second subset from verification. An erase verify voltage $E_{verify}$ is applied to each memory cell in the first subset while a voltage $V_{pass}$ is applied to each memory cell in the second subset. $E_{verify}$ is a voltage used to determine whether a memory cell has reached the erased state. For example, an $E_{verify}$ voltage of 0V can be applied to a memory cell to determine whether the memory cell has a threshold voltage below 0V, indicating an erased state. $V_{pass}$ is a voltage chosen to ensure that the memory cells of the second subset conduct, regardless of whether erased or not. In this manner, memory cells in the first subset are verified while the memory cells in the second subset are excluded from verification. Column 448 depicts the bias conditions for verifying whether the memory cells of the second subset are erased. The erase verify voltage $E_{verify}$ is applied to the memory cells in the second subset while $V_{pass}$ is applied to the memory cells in the first subset to exclude them from verification.

Figure 20:
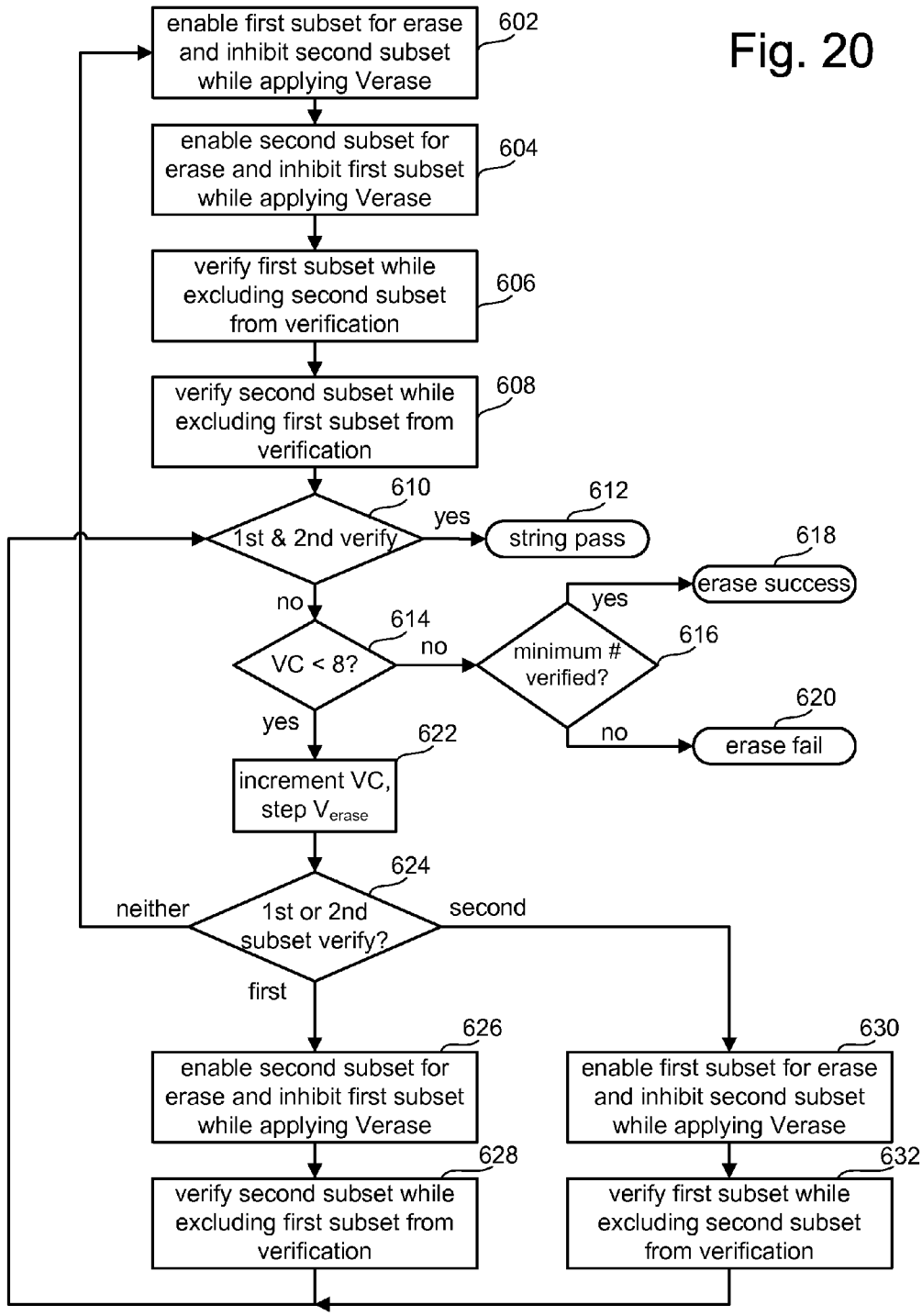
FIG. 20 is a flowchart for erasing a set of non-volatile storage elements in accordance with one embodiment.

FIG. 20 is a flowchart depicting a method in accordance with one embodiment for erasing a set of memory cells where a subset-based verification technique is used. At step 602, an erase voltage pulse is applied to the set while enabling a first subset of memory cells to be erased and inhibiting a second subset of memory cells from being erased. At step 604, an erase voltage pulse is applied to the set while enabling the second subset for erase and inhibiting the first subset from being erased. The first subset of memory cells is verified for an erased condition at step 606 while excluding the second subset of memory cells from verification. At step 608, the second subset of memory cells is verified for an erased condition while excluding the first subset of memory cells from verification. At step 610, it is determined whether the first and second subsets were verified as erased. If they were, a pass is reported for the string at step 612. In one embodiment, the erase operation continues after step 612 for other strings of the group (e.g., block) that are not yet verified as erased. The strings that are already verified for erase will be inhibited from erase during these additional operations.

If both the first and second subsets of memory cells are not verified as erased, as determined at step 610, it is determined at step 614 whether a verify counter is less than a maximum value. If the counter is not below the maximum value, it is determined at step 616 whether a minimum number of strings have been erased. If a minimum number have been erased, a success is reported for the erase operation at step 618. If the minimum number has not been erased, a fail is reported for the erase operation at step 620.

If the verify counter is less than the maximum value, $V_{erase}$ is increased by the step size and the verify counter is incremented at step 622. The method branches at step 624 based on the erased condition of the first and second subsets. If neither the first nor the second subset of memory cells are verified as erased, the method continues from step 624 to step 602. If the first subset of memory cells is verified as erased but the second subset of memory cells is not, the increased erase voltage is applied to the set at step 626 while the second subset is enabled for erase and the first subset is inhibited from erase. The second subset of memory cells is verified for an erased condition at step 628 while excluding the first subset of memory cells from verification. If the second subset of memory cells is verified as erased but the first subset is not, the first subset of memory cells is enabled for erase and the second subset inhibited from being erased at step 630. The first subset is verified for an erased condition at step 632 while excluding the second subset from verification. After steps 628 or 632, the method continues at step 610.

FIG. 21 depicts another set of bias conditions for independently erasing individual subsets of memory cells in a NAND string. In the embodiment of FIG. 21, the individual subsets are chosen so that each memory cell will have a first neighboring transistor at a first bias and a second neighboring transistor at a second bias when it is being erased. Since each memory cell has one neighbor at a first bias and a second neighbor at a second bias, a more consistent erase will be observed for each memory cell within a string of cells, when compared with traditional erase techniques.

Column 650 sets forth the bias conditions for erasing a first subset of memory cells A and column 652 sets forth the bias conditions for erasing a second subset of memory cells B. The subsets of memory cells include pairs of adjacent memory cells with two intervening memory cells before the next pair. In the particular embodiment of FIG. 21, subset A includes the memory cells of word lines WL0, WL1, WL4, WL5, etc. and subset B includes the memory cells of word lines WL2, WL3, WL6, WL7, etc.

While the memory cells in FIG. 21 don't have both neighbors at the same potential during erase, they do have the same bias conditions for each pair of neighboring transistors. Each memory cell will have one neighboring transistor at a 0V potential and one neighboring transistor at a floating potential when the erase voltage is applied with the cell enabled for erase. For example, the memory cell of word line WL0 (subset A), has a first neighboring transistor, the source side select gate, at a floating potential and a second neighboring transistor, the memory cell connected to word line WL1, at a 0V potential (column 650). The memory cell at WL1 (first subset) has the memory cell at word line WL2 floating and the memory cell at WL0 at 0V when the erase voltage is applied with it enabled for erase (column 650). The memory cell of word line WL2 (subset B) has a first neighboring transistor, the memory cell at WL1, at a floating potential and a second neighboring transistor, the memory cell at word line WL3, at a 0V potential when enabled for erase (column 652). The memory cell at WL3 (subset B) has the memory cell at word line WL4 floating and the memory cell at WL2 at 0V when the erase voltage is applied with it enabled for erase (column 652).

The net bias of neighboring transistors and associated charge coupling are the same for each memory cell erased according to FIG. 21. The combination or total coupling from a first neighbor biased to a first potential and a second neighbor biased to a second potential is about the same for each memory cell of the NAND string. A feature of various embodiments is the promotion of substantially equal charge coupling to each memory cell of the string when it is being erased. In the FIG. 21 embodiment, this is accomplished not by ensuring that each memory cell has both neighbors similarly biased, but by ensuring that the total charge coupling for a selected memory cell from its two most immediate neighbors along the string is about equal to that of each other memory cell when selected and enabled for erase.

FIG. 21 depicts subset-level erase verification in columns 654 and 656. The first subset is verified under the bias conditions of column 654. The erase verify voltage is applied to the memory cells of subset A while ensuring conduction of the memory cells in subset B by applying $V_{pass}$. The second subset is verified under the bias conditions of column 656. The erase verify voltage is applied to the memory cells of subset B while ensuring conduction of the memory cells in subset A by applying $V_{pass}$. In one embodiment, a string-level verification is used with the erase bias conditions of columns 650 and 652.

Different erase voltage values and erase voltage step sizes can be used in various embodiments when erasing different subsets of memory cells. When compared with traditional erase operations, the erase voltage can generally be made larger to achieve substantially similar erase rates when compared with traditional techniques. For example, as shown in FIGS. 11 and 13, the end memory cells of a NAND string erase slower than the interior memory cells because of charge coupling from the neighboring select gates that are floating during the operation. In accordance with the embodiment depicted in FIG. 15, every memory cell of the NAND string will experience roughly twice the positive charge coupling as the end memory cells in traditional erase operations because they will have two floating neighbors. Accordingly, the size of the erase voltage pulse can be increased over that of traditional erase operations to compensate for the positive charge coupling that may otherwise slow down erase times. In the embodiment depicted in FIG. 21, each memory cell will experience similar positive charge coupling to that of the end memory cells in traditional erase operations. Accordingly, a same or larger erase voltage pulse can be used when compared with traditional erase operations but smaller than that used for embodiments as depicted in FIG. 15. Other erase voltage pulse sizes can be used.

Figure 22A:
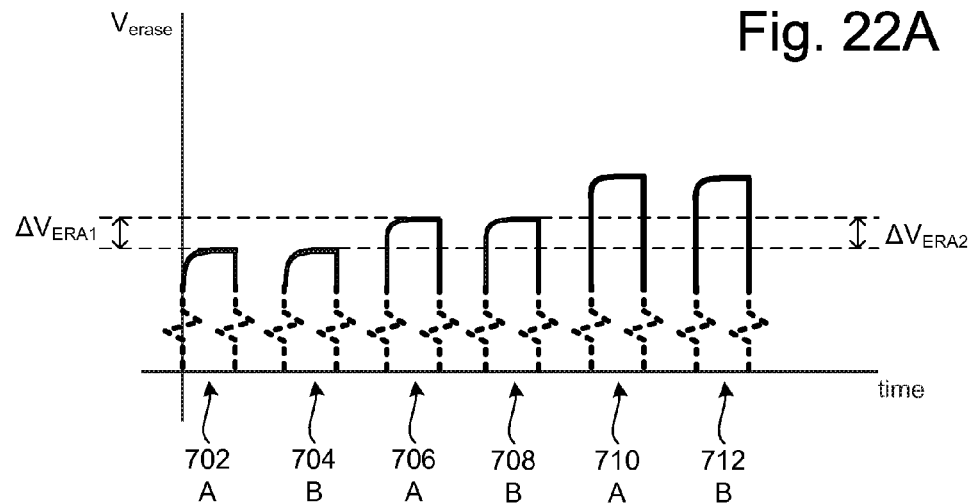
FIGS. 22A-22B are graphs depicting erase voltage signals in accordance with various embodiments.

In one embodiment, the size of the erase voltage pulse applied to the first subset of memory cells and the second subset of memory cells is the same. FIG. 22A depicts an erase voltage signal that can be used in accordance with one embodiment. A first pulse 702 is applied to the string with a first subset A of memory cells enabled for erase and a second subset B of memory cells inhibited from being erased. The first erase voltage pulse 702 has a magnitude of 14V in one embodiment. A second erase voltage pulse 704 is applied to the string with the second subset B of memory cells enabled for erase and the first subset A of memory cells inhibited from being erased. If each memory cell of the string is not verified as erased, a third erase voltage pulse 706 is applied with the first subset of memory cells enabled for erase and the second subset of memory cells inhibited from being erased. A fourth erase voltage pulse 708 is applied with the second subset of memory cells enabled for erase and the first subset of memory cells inhibited from being erased. Additional pulses beyond pulses 706 and 708 can be applied if needed. In one embodiment, subset-level verification is performed and additional erase voltage pulses may be applied for one subset but not another subset. In one embodiment, each pulse is applied regardless of whether any subsets are verified as erased. Any strings having a first subset and/or second subset of cells already verified as in an erased state can be inhibited from erase at the appropriate time.

In one embodiment as shown in FIG. 22A, the first erase voltage pulse 702 is increased by a first step size $\Delta_{VERA1}$ for the third erase voltage pulse 706 and the second erase voltage pulse 704 is increased by a second step size $\Delta_{VERA2}$. In one embodiment, $\Delta_{VERA1}$ is equal to $\Delta_{VERA2}$. In another embodiment, $\Delta_{VERA1}$ is larger or smaller than $\Delta_{VERA2}$. Pulses 702-712 have been described as originating from the same erase voltage signal. In one embodiment, a first erase voltage signal is used to provide pulses 702, 706, 710, etc. for erasing the memory cells of subset A and a second erase voltage signal is used to provide pulses 704, 708, 712, etc.

Figure 22B:
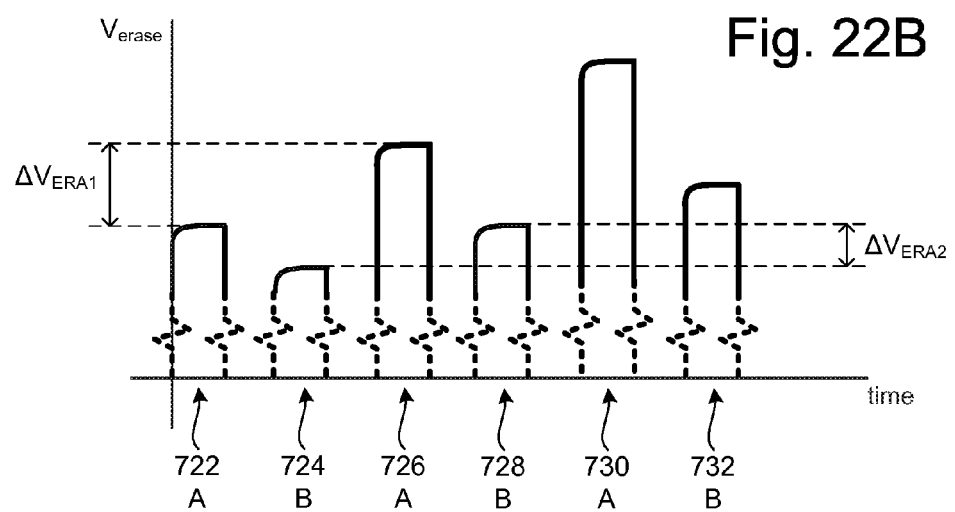

FIG. 22B depicts another embodiment of the erase voltage signal(s) used to individually erase a first and second subset of memory cells. The first erase voltage pulse for each subset being erased is a different size. For example, a first erase voltage pulse 720 having a first peak value can be applied to the set of memory cells with the first subset enabled for erase and the second subset inhibited from being erased. A second erase voltage pulse 722 having a second peak value can be applied to the set of memory cells with the second subset enabled for erase and the first subset inhibited from being erased.

In one embodiment, the erase voltage pulse(s) applied to the subset of memory cells that is the first to be erased is larger than the erase voltage pulse(s) applied to the subset of memory cells that is the second to be erased. When the first subset is being erased, positive charges at the floating gates of memory cells in the second subset (which have not yet been erased) will couple to the floating gates of the memory cells in the first subset. This positive charge coupling will decrease the erase potential across the tunnel dielectric and thus slow down the erase rate of these cells. When the second subset of memory cells is erased, however, the first subset of memory cells has already been at least partially erased. Thus, the positive charge coupling associated with these cells should be less than that of the memory cells in the first subset. Accordingly, a larger erase voltage size can be used when erasing the memory cells of the first subset to achieve substantially similar erase rates between the two subsets. In one embodiment, the erase voltage step size for the first subset, $\Delta_{VERA1}$, is larger than the erase voltage step size, $\Delta_{VERA2}$, for the second subset.

In one embodiment, an erase operation and the sizes of the erase voltage pulses are chosen so that all or almost all memory cells will erase after just one application of the erase voltage. The sizes of the erase voltage pulses can further be selected so that all or almost all memory cells will erase after just one application of the erase voltage, even after the memory has undergone many write/erase cycles, which typically slow down erase rates as materials degrade and charges are trapped. In one such embodiment, the size of the erase voltage pulse applied to the second subset is smaller than that applied to the first subset to avoid over-erasing the memory cells in the second subset.

Capacitive coupling can also lead to disparate behavior amongst memory cells of a NAND string during soft programming operations. A soft programming operation is typically carried out by applying soft programming pulses to all the word lines of a selected block at the same time. Soft programming is performed after erasing a set of memory cells. Soft programming is performed to narrow the width of the erased threshold distribution for the set of memory cells and also to normalize the erased threshold distribution of the individual memory cells within the set. Soft programming pulses are lower in amplitude than regular programming pulses (e.g., as shown in FIG. 6) to avoid that the cells reach a programmed state. What is desired as a result of the soft programming is that the cells have a narrower erase threshold voltage distribution. Consequently, the threshold voltages are not intended to be shifted into a programmed state range.

FIG. 10 shows an exemplary set of bias conditions that can be applied to a block of memory cells for soft programming. The bit line and source lines are grounded to enable programming for each string. A string to be inhibited from soft programming will have $V_{DD}$ applied to its bit line. The drain select gate line SGD is at $V_{DD}$ while the source select gate line SGS is at 0V. In some embodiments, $V_{SG}$ (e.g., ~6V) may initially be applied to the drain select gate line SGD and then lowered to $V_{DD}$ before application of a soft programming pulse. This can allow boosting for soft programming inhibition in NAND strings not to be subjected to soft programming. A soft programming pulse $V_{spgm}$ is applied to each word line of the block to simultaneously soft program all the storage elements. An additional pulse can be applied after verification to continue soft programming for selected NAND strings.

After application of each soft programming pulse, a verify operation as shown in FIG. 10 is performed. During the verification for a soft programming operation, conduction through a NAND string is tested with each of the memory cells receiving the erase verify voltage at its gate. Once a certain number of NAND strings in the selected block have reached a non-conducting state during the erase verify operation (indicating that at least one cell of the string has reached the erase verify level), soft programming ends. The result of soft programming is that the distribution of the erased memory cells in the string shifts up closer to the erase verify level. Using soft programming, the erase threshold voltage distribution can be shifted up to a level close to the erase verify level, even if the memory cells were originally over-erased.

Because of capacitive coupling from the select gates to the memory cells of the end word lines of a NAND string, the soft programming behavior of the memory cells of the string may be different. Capacitive coupling between the select gates and the end memory cells slows down these cells during the soft programming operation. Each interior memory cell will have both neighboring memory cells at the soft programming voltage $V_{spgm}$. The first and last (end) memory cells neighboring the select gates, however, will have one neighbor at the soft programming voltage $V_{spgm}$ and one neighbor at either the drain select gate line bias $V_{DD}$ or the source select gate line bias 0V. Thus, it can be expected that the memory cells of the end word lines will be in a deeper erased state than those of the interior word lines after soft programming.

Figure 23:
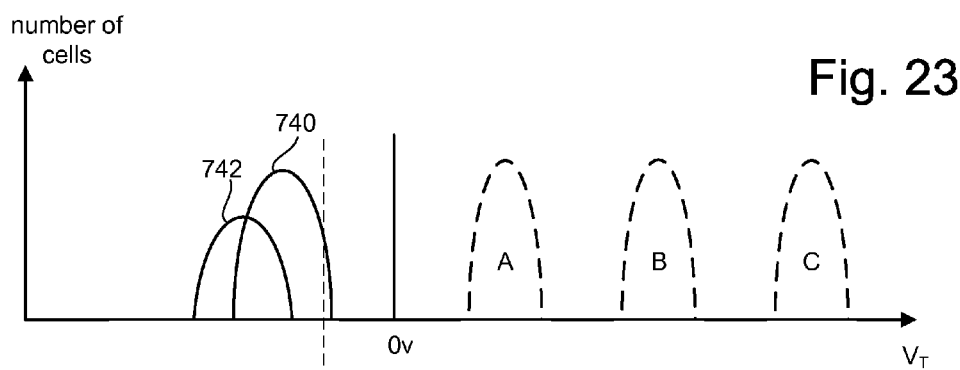
FIG. 23 depicts the threshold voltage distributions for a set of non-volatile storage elements after being erased.

FIG. 23 shows the erased threshold voltage distribution for the memory cells of a NAND string or group of NAND strings after undergoing soft programming. Distribution 740 depicts the erased threshold distribution of the interior word line memory cells after undergoing soft programming. Soft programming has shifted this erased threshold voltage distribution closer to the erase verify level. Since the verification for soft programming verifies a group of cells as successfully soft programmed when a predetermined number of NAND strings are non-conductive under application of the erase verify voltage, a certain number of cells will have their threshold voltage shifted beyond the erase verify level. The actual number having a threshold voltage higher than the erase verify level will depend upon the actual verification scheme employed. For example, if the scheme verified soft programming as complete when a single string becomes non-conductive, only one cell in the group may be higher than the verify level. In other schemes, thousands of cells within the group may have their threshold voltage shifted just beyond the erase verify level. Distribution 742 depicts the threshold voltages of the end memory cells. Because of the slower soft programming time for the end memory cells, their threshold voltages have not been shifted as close to the erase verify level.

In accordance with one embodiment, a set of memory cells such as a NAND string or block including many NAND strings is soft programmed by applying soft programming voltages to the set of memory cells during discrete intervals under different bias conditions. The different bias conditions used for each interval are selected to reduce differences between the programming rates of individual memory cells within the string. The different programming characteristics of the end memory cells of a string that result from capacitive coupling from the select gates can be reduced.

During soft programming, each interior memory cell of a NAND string will experience similar capacitive charge coupling based on its neighboring memory cells. Each interior word line is bordered by two word lines, both of which receive $V_{spgm}$. The end memory cells, however, are each bordered by one other memory cell and one select gate transistor. The memory cell at word line WL0 is bordered by the cell at word line WL1 and the source select gate. The memory cell at last word line WLn is bordered by the cell at word line WLn-1 and the drain select gate. The source select gate line SGS is at 0V while the drain select gate line is at $V_{DD}$ (e.g. 2.5V). Unlike an erase operation, the select gates are each at different biases during soft programming. Thus, identical bias conditions for every memory cell of the string cannot be obtained using the previously described partitions and biasing of word lines for erasing. However, similar bias conditions and improved uniformity in soft programming rates can still be obtained using similar techniques.

FIG. 24 is a table depicting the bias conditions for a NAND string of non-volatile storage elements during a soft programming operation in accordance with one embodiment. Other bias conditions and different groupings of cells can be made. The set of memory cells that forms the NAND string is divided into individual subsets of memory cells that are soft programmed during discrete time periods. The word lines that connect to the memory cells of the string are divided into subsets that correspond to the subsets of memory cells. Word lines WL0-WLn are divided into a first subset of word lines (subset A) that connect to a first subset of memory cells and a second subset of word lines (subset B) that connect to a second subset of memory cells. As previously described, while reference may be made to a single NAND string for clarity of description, it will be appreciated that in a typical NAND flash memory implementation, each word line connects to one memory cell from more than one NAND string. Thus, the described operations can take place in parallel for many NAND strings.

In FIG. 24, the word lines are divided as in FIG. 15. The first subset of word lines includes WL0 (adjacent the source select gate line) and every other word line following word line WL0 as one proceeds from the source side of the string to the drain side of the string. Thus, subset A includes word lines WL0, WL2, WL4 . . . WLn-1. The second subset of word lines includes word line WL1 and every other word line thereafter as one proceeds from the source side of the string to the drain side of the string. Thus, subset B includes word lines WL1, WL3, WL5 . . . WLn.

Each subset of memory cells is separately soft programmed as shown in columns 750 and 752. The bias conditions of column 750 are applied during a first period of time to soft program the memory cells of subset A while inhibiting soft programming of the cells of subset B. The word lines of subset A receive the soft programming voltage $V_{spgm}$ while the word lines of subset B receive an intermediate voltage $V_{use1}$. $V_{use1}$ is a small positive voltage and inhibits soft programming of the memory cells receiving it. The bias conditions of column 752 are applied during a second period of time to soft program the memory cells of subset B while inhibiting soft programming of the cells of subset A. The word line of subset B receive the soft programming voltage $V_{spgm}$ while the word lines of subset A receive the intermediate voltage $V_{use1}$.

By utilizing the individual soft programming sub-operations in FIG. 24, the differences in soft programming behavior of each memory cell of the string can be reduced. $V_{use1}$ is selected so that each memory cell will have similarly biased neighboring transistors when it is soft programmed. The exact same conditions for each cell cannot be achieved as during the erase operations previously described when both the select gates are at the same bias. However, an appropriate value of $V_{use1}$ can be selected to reduce differences in programming rates. The source select gate is at 0V during soft programming and the drain select gate is at $V_{DD}$ which is typically about 2.5V. A voltage between the two values applied to the select gate lines can be selected for $V_{use1}$. For example, a value of about 1.25V is used in one embodiment. This will more normalize the programming rate between the end memory cells and the interior memory cells. Other values of $V_{use1}$ can be used as well. In one embodiment, $V_{use1}$ is equal to either the source select gate line bias or the drain select gate line bias.

During the first soft programming operation depicted in column 750, each interior memory cell of subset A has both of its immediately adjacent memory cells at the $V_{use1}$ potential when the soft programming pulse is applied. The memory cell at WL0 of subset A will have one adjacent transistor (source select gate) at 0V and one adjacent transistor at $V_{use1}$. But because the difference in $V_{use1}$ and 0V is very small, the erase rate of the end memory cell at word line WL0 will erase at approximately the same rate as the interior memory cells of subset A. Any capacitive coupling effects from neighboring transistors during soft programming of subset A will be substantially equal for each memory cell of the subset. Contrast this with the traditional technique of FIG. 10. In FIG. 10, each interior memory cell has both its neighboring memory cells at $V_{spgm}$ when undergoing soft programming while the cell at word line WL0 has one neighboring memory cell at $V_{spgm}$ and one neighboring transistor at 0V. The difference between $V_{spgm}$ and 0V is larger than the difference between $V_{use1}$ (~1.25V) and 0V causes a substantially different soft programming rate for that cell.

During the second soft programming operation depicted in column 752, each interior memory cell of subset B has both of its immediately adjacent transistors at the $V_{use1}$ potential when the soft programming pulse is applied. The end memory cell at word line WLn of subset B will have one adjacent transistor (drain select gate) at $V_{DD}$ (about 2.5V) and one adjacent transistor at $V_{use1}$. Again, because the difference in $V_{use1}$ and $V_{DD}$ is very small, the erase rate of the end memory cell at word line WLn will erase at approximately the same rate as the interior memory cells of subset B. Any capacitive coupling effects from neighboring transistors during soft programming of subset B will be substantially equal for each memory cell of the subset. Moreover, the erase rates between all the memory cells of subset B and all the memory cells of subset A will be substantially equal, as the capacitive coupling effects experienced by each subset are substantially equal.

Various factors can influence the selection of a value for $V_{use1}$ to be used for the word lines inhibited from soft programming. Particular NAND strings in block of cells being soft programmed that share a common set of word lines may need to be inhibited from soft programming during one or more applications of a soft programming pulse. Typically, the combination of applying $V_{DD}$ to the bit line of the strings to be inhibited along with the soft programming voltage applied to the word lines boosts the channel region of the string to be inhibited by a sufficient amount to prevent programming. In the disclosed embodiments, the channel region of a to be inhibited NAND string associated with the word lines receiving $V_{spgm}$ needs to be boosted. If the value of $V_{use1}$ is low enough to cutoff the channel regions of the unselected subset of cells, $V_{spgm}$ will provide sufficient boosting for the channel region of the selected subset of cells in the to be inhibited string to prevent soft programming. If $V_{use1}$ is large enough to turn on the associated cells and connect the entire channel region, $V_{spgm}$ applied to half the word lines will be required to provide boosting for the entire string. Care should be taken in choosing $V_{use1}$ and $V_{spgm}$ to ensure proper boosting. For more information on boosting, see U.S. patent application Ser. No. 10/823,421 entitled "Programming Inhibit for Non Volatile Memory," incorporated by reference herein in its entirety.

Figure 25:
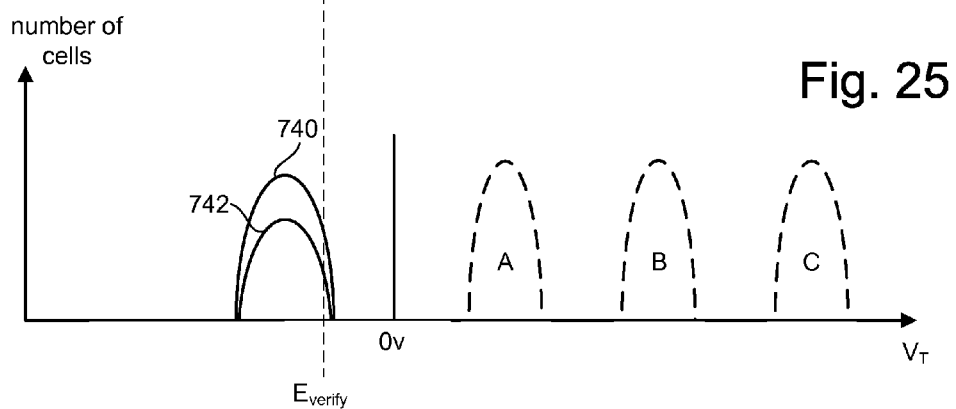
FIG. 25 depicts the threshold voltage distributions for a set of non-volatile storage elements after being erased and soft programmed in accordance with one embodiment.

FIG. 25 depicts the threshold voltage distributions for a set of memory cells after undergoing soft programming according to the embodiment of FIG. 24. Both the erased threshold voltage distributions for the interior and end word lines have been moved up close to the erase verify level. The interior word line distribution 750 is shifted up close to the erase verify level as would normally occur. Because the difference in programming rate of the end memory cells is addressed through the partitioned subset programming technique, the end memory cells are no longer more deeply erased after soft programming as was shown in FIG. 23. The threshold voltage distribution for the end memory cell is moved up close to the verify level as with the interior memory cells.

Figure 26:
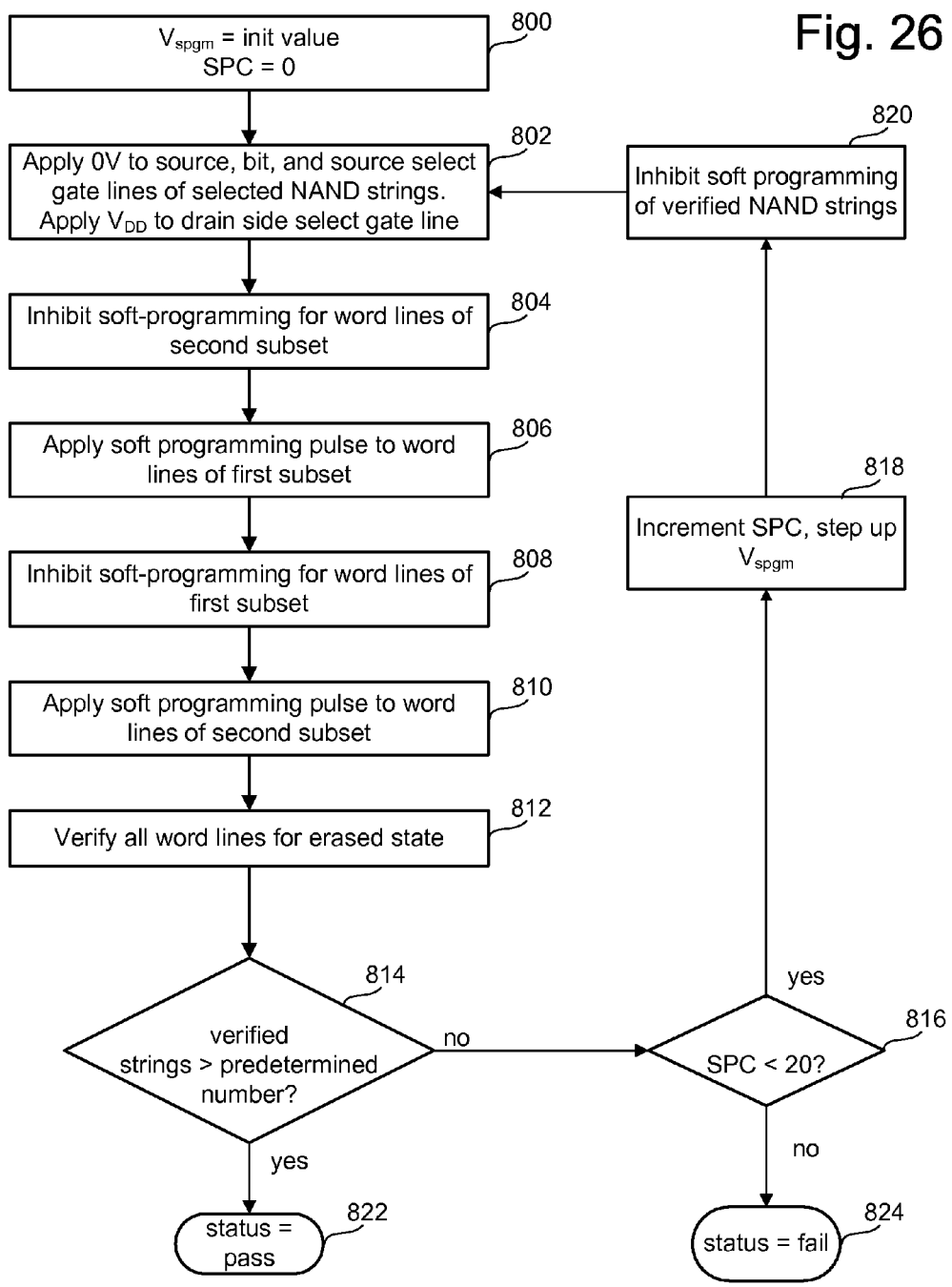
FIG. 26 is a flowchart for soft programming a set of non-volatile storage elements in accordance with one embodiment.

FIG. 26 is a flowchart of a method for soft programming in accordance with one embodiment. At step 800, the soft programming voltage signal $V_{spgm}$ is set to its initial value and the soft programming counter SPC is initialized to zero. The source, bit, and source select gate lines are grounded, and $V_{DD}$ is applied to the drain select gate line at step 802. The second subset of word lines is inhibited from soft programming at step 804. At step 806, a soft programming pulse is applied to the first subset of word lines while the second subset of word lines are inhibited from soft programming. At step 808, the first subset of word lines is inhibited from soft programming. At step 810, a soft programming pulse is applied to the word lines of the second subset, while the first subset of word lines is inhibited.

Soft programming can be inhibited for the unselected subset by applying a small positive voltage $V_{use1}$ to the word lines of the unselected subset as previously described. Each of the memory cells in subset B will be biased at the same $V_{use1}$ voltage while applying the soft programming pulse to the memory cells of subset A. Thus, each interior memory cell in subset A will have both of its neighboring memory cells at the same bias. Each of the memory cells in subset A will be biased at the same voltage while applying the soft programming pulse to the memory cells of subset B. Thus, each interior memory cell in subset B will have both of its neighboring memory cells at the same bias. Since the first and last memory cells of the string neighbor the select gates, which are at different voltages, a value of $V_{use1}$ is chosen so that the first and last memory cells will have similarly biased neighboring lines. If the source and drain select gates are at 2.5V and 0V respectively, and a value of 1.25V is chosen for $V_{use1}$, the first memory cell (neighboring the drain select gate) will have a neighboring memory cell (WL1) at 1.25V and a second neighboring transistor (the drain side select gate) at 0V. The last memory cell (neighboring the source select gate) will have a first neighboring memory cell (WLn−1) at 1.25V and a second neighboring transistor (the source select gate) at 2.5V. Thus, the capacitive coupling effects experienced by the first and last word lines will be approximately the same as that experienced by the interior word lines of subset A and subset B.

At step 812, a verify operation is carried out for each word line of the set of word lines being erased. The bias conditions depicted in column 754 of FIG. 24 are used at step 812 in one embodiment. The select gates are turned on by applying $V_{SG}$ while $V_{DD}$ is applied to the source line and the bit line is allowed to float. An erase verify voltage $E_{verify}$ is applied to each word line and conduction through the NAND string detected. If the NAND string is non-conductive, it indicates that at least one memory cell of the string has reached the $E_{verify}$ level and the string is verified as soft programmed. At step 814, it is determined if the number of non-conductive strings is greater than a predetermined number. If the number of non-conductive strings is greater than this number, a status of pass is reported at step 822. If the number of verified strings is not greater than the predetermined number, the soft programming counter SPC is checked against a soft programming limit valve (e.g., 20). If the counter is less than this valve, the counter SPC is incremented by one at step 818 and the value of $V_{spgm}$ stepped up by an increment value. At step 820, soft programming is inhibited for those NAND strings that were successfully verified at step 812. Soft programming is inhibited in a NAND string in one embodiment by raising the corresponding bit line of the string to $V_{DD}$. By raising the bit line voltage, the channel area of the inhibited NAND string will be boosted to a high voltage during the next soft programming cycle. The voltage difference between the floating gates of the memory cells and the channel area of the inhibited NAND string will be too low to cause further soft programming of the cells. The method then proceeds to step 802 for further soft programming.

In FIGS. 24 and 26, soft programming verification is performed at the string level. Accordingly, further iterations of soft programming after verification will continue to apply soft programming pulses to non-verified NAND strings during both first subset and second subset soft programming, regardless of the individual status of the subsets. FIG. 27 is a table illustrating a set of bias conditions that can be used to soft program and verify individual subsets. Columns 830 and 832 again depict the bias conditions for soft programming subset A and subset B, respectively. In column 830, subset A is soft programmed while subset B receives $V_{use1}$ to inhibit soft programming. In column 832, subset B is soft programmed while subset A receives $V_{use1}$ to inhibit soft programming.

The bias conditions for individually verifying each subset of memory cells in a NAND string are shown in columns 834 and 836. In column 834, the first subset is verified while inhibiting the second subset from verification. In column 836, the second subset is verified while inhibiting the first subset from verification. To verify the first subset, the bit line is floated, the select gate lines raised to $V_{SG}$, and the source line raised to $V_{DD}$. The verify voltage is applied to each word line of the first subset while applying $V_{pass}$ to each word line of the second subset. $V_{pass}$ is a small positive voltage sufficient to turn on each of the transistors of the second subset, even if not fully erased (e.g. 1V). In one embodiment, the same voltage level can be used for $V_{pass}$ and $V_{use1}$. In this manner, only the state of the memory cells of the first subset is tested. When at least one memory cell from the first subset reaches the verify level, the string will be non-conductive and the first subset verified as soft programmed. To verify the second subset, $V_{pass}$ is applied to each word line of the first subset while applying the verify voltage to each word line of the second subset. Conduction of each memory cell in the second subset is ensured while testing whether any memory cells of the first subset have been programmed to the verify level.

FIG. 28 is a flowchart depicting a method for soft programming in one embodiment. FIG. 28 can be used to implement the bias conditions for individual subset verification illustrated in FIG. 27. At step 850, the soft programming voltage signal $V_{spgm}$ is initialized to its starting value and the soft programming counter SPC is initialized to zero. The source, bit, and source select gate lines are grounded, and $V_{DD}$ is applied to the drain select gate line at step 852. The second subset of word lines is inhibited from soft programming at step 854. At step 806, a soft programming pulse is applied to the first subset of word lines while the second subset of word lines are inhibited from soft programming. The first subset of word lines is inhibited from soft programming at step 858. At step 860, a soft programming pulse is applied to the second subset of word lines while the first subset of word lines are inhibited from soft programming. The first subset of word lines are verified at step 862 while excluding the second subset of word lines from verification. The verify voltage $E_{verify}$ can be applied to the first subset of word lines while applying $V_{pass}$ to the second subset of word lines to ensure conduction of those memory cells. The second subset of word lines are verified at step 864 while excluding the first subset of word lines from verification. The verify voltage $E_{verify}$ can be applied to the second subset of word lines while applying $V_{pass}$ to the first subset of word lines.

After individually verifying the subsets of memory cells in each NAND string, the number of strings passing both verification operations is checked against a predetermined number at step 866. If the number of verified NAND strings is greater than the predetermined number, a status of pass is reported at step 878. If the number of verified strings is not greater than the predetermined number, the soft programming counter is checked against a soft programming value at step 868. If the counter has reached the limit value, a status of fail for the soft programming operation is reported at step 880. If the counter is below the threshold, it is incremented by one at step 870. The value of the soft programming voltage is also stepped up by an increment value at step 870.

At steps 872-876, the individual NAND strings are set up for the next iteration of the soft programming operation. At step 872, those NAND strings whose second subset of memory cells was successfully verified at step 864 but whose first subset of memory cells was not successfully verified at step 862, are setup. These NAND strings will be inhibited from soft programming during soft programming of the second subset of memory cells at step 860 during the next iteration. The bit line voltage of these NAND strings will be raised to $V_{DD}$ after applying the soft programming voltage to the first subset of word lines at step 856. Those NAND strings whose first subset of memory cells was successfully verified at step 862 but whose second subset of memory cells was not successfully verified at step 864 are setup for the next soft programming iteration at step 874. These NAND strings will be inhibited from soft programming during soft programming of the first subset of memory cells at step 856. The bit line voltage of these NAND strings will be raised to $V_{DD}$ prior to applying the soft programming voltage at step 856. The bit line voltage of these NAND strings will be lowered to 0V to enable soft programming of the string before applying the soft programming voltage to the second subset of word lines at step 860. Finally, those NAND strings whose first and second subsets of memory cells were successfully verified are setup at step 876. These NAND strings will be inhibited from soft programming during soft programming of both subsets at steps 856 and 860. The bit line voltage of these NAND strings will be raised to $V_{DD}$ during both applications of the soft programming voltage.

FIG. 29 is a table depicting another set of bias conditions for individually soft programming subsets of memory cells in a NAND string. The individual subsets are chosen so that each memory cell will have a first neighboring transistor at a first bias and second neighboring transistor at a second bias when it is being soft programmed. Again, because the two select gates are at different bias levels during soft programming, a value of $V_{use1}$ between the two levels is used. While the end memory cells will have slightly different neighboring transistor bias conditions than the interior memory cells, the small difference in voltage between $V_{use1}$ and the select gate voltages will still lead to substantially similar soft programming rates amongst all cells.

Column 900 sets forth the bias conditions for soft programming the first subset of memory cells and column 902 sets forth the bias conditions for soft programming the second subset of memory cells. Each subset of memory cells includes pairs of adjacent memory cells with two intervening memory cells before the next pair of the subset. In the particular embodiment of FIG. 29, the first subset includes the memory cells of word lines WL0, WL1, WL4, WL5, etc. and the second subset includes the memory cells of word lines WL2, WL3, WL6, WL7, etc.

Using the bias conditions of FIG. 29, each memory cell will have a first neighboring transistor at a first bias and a second neighboring transistor at a second bias when being soft programmed. Importantly, the bias conditions for the neighboring transistors will be substantially the same for each memory cell of the string leading to comparable erase rates between cells. The first and last memory cells of the string will have one neighboring transistor at a slightly different bias than the neighbor for the interior memory cells of the string. However, the difference in bias is small and will not provide a significant difference in erase rates for these cells. When selected for soft programming, each interior memory cell will have a first neighboring transistor at the soft programming voltage level $V_{spgm}$ and a second neighboring transistor at the small positive voltage $V_{use1}$. For example, when the memory cell at word line WL1 is soft programmed (column 900), its first neighboring memory cell at word line WL0 is at $V_{spgm}$ and its second neighboring memory cell at word line WL2 is at $V_{use1}$. When the end memory cells are selected for soft programming, they will have one neighboring transistor at the soft programming voltage level $V_{spgm}$ and a second neighboring transistor at either 0V or $V_{DD}$. For example, the memory cell at word line WL0 will have one neighboring transistor—the memory cell at word line WL1—at the soft programming voltage level $V_{spgm}$ and one neighboring transistor—the source select gate—at 0V. The last memory cell of the NAND string at word line WLn will have one neighboring transistor—the memory cell at word line WLn−1—at the soft programming voltage level $V_{spgm}$ and one neighboring transistor at—the drain select grade—$V_{DD}$.

The net bias of neighboring transistors and associated charge coupling are substantially the same for each memory cell soft programmed according to FIG. 29. The combination of total coupling from a first neighbor biased at a first potential and a second neighbor biased at a second potential is about the same for each memory cell of the string, leading to substantially similar soft programming rates.

FIG. 29 further depicts subset-level verification in columns 904 and 906. The first subset is verified using the bias conditions of column 904. The erase verify voltage level is applied to the word lines of the first subset while ensuring conduction of the memory cells of the second subset by applying $V_{pass}$ to those word lines. The second subset is verified using the bias conditions of column 906. The erase verify voltage level is applied to the word lines of the second subset while ensuring conduction of the memory cells of the first subset by applying $V_{pass}$ to those word lines. In one embodiment, a string-level verification as shown in column 754 of FIG. 24 can be used with the soft programming bias conditions of FIG. 29.

The above examples are provided with respect to NAND type flash memory. However, the principles of the present invention have application to other types of non-volatile memories which utilize a serial structure, including those currently existing and those contemplated to use new technology being developed.

The foregoing detailed description has been presented for purposes of illustration and description. It is not intended to be exhaustive or to limit the disclosure to the precise form disclosed. Many modifications and variations are possible in light of the above teaching. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A non-volatile memory system, comprising:
a set of non-volatile storage elements, said set includes a first subset of non-volatile storage elements and a second subset of non-volatile storage elements; and
managing circuitry in communication with said set of non-volatile storage elements, said managing circuitry applies a soft programming voltage to said first subset of storage elements while inhibiting said second subset of storage elements from soft programming and applies said soft programming voltage to said second subset of storage elements while inhibiting said first subset of storage elements from soft programming, said managing circuitry verifies whether said set of storage elements is soft programmed and repeats application of said soft programming voltage to at least one of said first subset and said second subset if said set is not verified as soft programmed, "non-volatile storage elements of said first subset are not in said second subset".

2. The non-volatile memory system of claim 1, wherein said managing circuitry repeats application of said soft programming voltage to at least one of said first subset and said second subset until said set is verified as soft programmed.

3. The non-volatile memory system of claim 2, wherein said managing circuitry verifies whether said set of storage elements is soft programmed by simultaneously verifying whether said first subset of storage elements is soft programmed and whether said second subset of storage elements is soft programmed.

4. The non-volatile memory system of claim 1, wherein said managing circuitry verifies whether said set of storage elements is soft programmed by verifying whether said first subset of storage elements is soft programmed while excluding said second subset of storage elements from verification and verifies whether said second subset of storage elements is soft programmed while excluding said first subset of storage elements from verification.

5. The non-volatile memory system of claim 4, wherein:
said managing circuitry verifies whether said first subset is soft programmed by applying a verify voltage to each storage element of said first subset and applying a voltage larger than said verify voltage to each storage element of said second subset; and
said managing circuitry verifies whether said second subset is soft programmed by applying said verify voltage to each storage element of said second subset and applying said voltage larger than said verify voltage to each storage element of said first subset.

6. The non-volatile memory system of claim 4, wherein said managing circuitry repeats application of said soft programming voltage to at least one of said first subset and said second subset by:
- repeating application of said soft programming voltage to said first subset if said second subset is verified as soft programmed and said first subset is not verified as soft programmed;
- repeating application of said soft programming voltage to said second subset if said first subset is verified as soft programmed and said second subset is not verified as soft programmed; and
- repeating application of said soft programming voltage to said first subset and application of said soft programming voltage to said second subset if said first subset and said second subset are not verified as soft programmed.

7. The non-volatile memory system of claim 1, further comprising:
- a first select gate coupled to a first non-volatile storage element of said set;
- a second select gate coupled to a second non-volatile storage element of said set;
- wherein said managing circuitry applies a first voltage to said first select gate and a second voltage to said second select gate while applying said soft programming voltage to said first subset and said second subset of storage elements, said second voltage is larger than said first voltage;
- wherein said managing circuitry inhibits said second subset from soft programming while applying said soft programming voltage to said first subset by applying a third voltage to each storage element of said second subset, said third voltage is larger than said first voltage and smaller than said second voltage; and
- wherein said managing circuitry inhibits said first subset from soft programming while applying said soft programming voltage to said second subset by applying said third voltage to each storage element of said first subset.

8. The non-volatile memory system of claim 1, further comprising:
- a first select gate coupled to a first non-volatile storage element of said set;
- a second select gate coupled to a second non-volatile storage element of said set;
- wherein said first subset of storage elements includes said first storage element and every other storage element of said set proceeding in a bit line direction of said set; and
- wherein said second subset includes said second storage element and every other storage element of said set proceeding in said bit line direction of said set, said second subset includes a third non-volatile storage element adjacent to said first non-volatile storage element.

9. The non-volatile memory system of claim 1, wherein:
- said set of non-volatile storage element is a string of non-volatile storage elements;
- said first subset includes a first non-volatile storage element adjacent to a first select gate for said string and a second non-volatile storage element adjacent to said first non-volatile storage element; and
- said second subset includes a third non-volatile storage element adjacent to said second non-volatile storage element and a fourth non-volatile storage element adjacent to said third non-volatile storage element.

10. The non-volatile memory system of claim 9, wherein:
- said first subset includes a fifth non-volatile storage element adjacent to said fourth non-volatile storage element and a sixth non-volatile storage element adjacent to said fifth non-volatile storage element; and
- said second subset includes a seventh non-volatile storage element adjacent to a second select gate for said string.

11. The non-volatile memory system of claim 1, further comprising:
- a plurality of word lines coupled to said set of non-volatile storage elements;
- a first select gate adjacent to a first non-volatile storage element of said set, said first storage element is coupled to a word line n of said plurality of word lines;
- wherein said first subset of storage elements includes storage elements of said set of storage elements that are coupled to word lines of said plurality in a series defined by $\{n;\ n+2;n+4;\ \ldots\}$; and
- wherein said second subset of storage elements includes storage elements of said set of storage elements that are coupled to word lines of said plurality in a series defined by $\{n+1;n+3;n+5;\ \ldots\}$.

12. The non-volatile memory system of claim 1, wherein:
- a plurality of word lines coupled to said set of non-volatile storage elements;
- a first select gate adjacent to a first non-volatile storage element of said set, said first storage element is coupled to a word line n of said plurality of word lines;
- wherein said first subset of storage elements includes storage elements of said set of storage elements that are coupled to word lines of said plurality in a series defined by $\{n;\ n+1;n+4;n+5;\ \ldots\}$; and
- wherein said second subset of storage elements includes storage elements of said set of storage elements that are coupled to word lines of said plurality in a series defined by $\{n+2;n+3;n+6;n+7;\ \ldots\}$.

13. The non-volatile memory system of claim 1, wherein: said set of non-volatile storage elements is a NAND string.

14. The non-volatile memory system of claim 1, wherein: said set of non-volatile storage elements is a set of multi-state flash memory cells.

15. The non-volatile memory system of claim 1, wherein: said managing circuitry includes at least one of a controller and a state machine.

* * * * *